(12) United States Patent
Ooishi

(10) Patent No.: US 6,917,540 B2
(45) Date of Patent: Jul. 12, 2005

(54) THIN FILM MAGNETIC MEMORY DEVICE STORING PROGRAM INFORMATION EFFICIENTLY AND STABLY

(75) Inventor: Tsukasa Ooishi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 211 days.

(21) Appl. No.: 10/396,481

(22) Filed: Mar. 26, 2003

(65) Prior Publication Data

US 2004/0057281 A1 Mar. 25, 2004

(30) Foreign Application Priority Data

Sep. 20, 2002 (JP) ........................................ 2002-275312

(51) Int. Cl.$^7$ .............................................. G11C 11/15
(52) U.S. Cl. ........................ 365/173; 365/171; 365/158
(58) Field of Search ................................ 365/173, 171, 365/158

(56) References Cited

U.S. PATENT DOCUMENTS 6,324,093 B1    11/2001  Perner et al.
6,347,056 B1     2/2002  Ledford et al.
6,349,054 B1 *   2/2002  Hidaka ........................ 365/173
6,683,807 B2 *   1/2004  Hidaka ........................ 365/161
6,778,432 B2 *   8/2004  Ohtani ........................ 365/171
6,791,876 B2 *   9/2004  Tanizaki et al. ............. 365/171

FOREIGN PATENT DOCUMENTS

JP         2001-217398 A      8/2001

* cited by examiner

*Primary Examiner*—Anh Phung
(74) *Attorney, Agent, or Firm*—Burns, Doane, Swecker & Mathis, L.L.P.

(57) ABSTRACT

Each of program cell and memory cells includes a magnetic storage portion of the same configuration. The program cell further includes a state change portion. That is, the program cell has the same structure as the memory cell, except that the state change portion is additionally provided thereto. As such, the program cell can be provided efficiently, as it can be designed the same as the memory cell in terms of the magnetic storage portion and others. The state change portion makes a transition to a fixed state based on an electrical change. Thus, the state change portion prevents program information from being rewritten by a magnetic noise or the like, and ensures stable storage of the program information.

10 Claims, 27 Drawing Sheets

THIN FILM MAGNETIC MEMORY DEVICE STORING PROGRAM INFORMATION EFFICIENTLY AND STABLY

BACKGROUND OF THE INVENTION

1. Field of the Invention

The present invention relates to thin film magnetic memory devices, and more particularly to a thin film magnetic memory device provided with memory cells having magnetic tunnel junctions (MTJ) (hereinafter, also simply referred to as the "MTJ memory cells").

2. Description of the Background Art

In recent years, a magnetic random access memory (MRAM) device has attracted attention as a next-generation nonvolatile memory device. The MRAM device stores data in a non-volatile manner using a plurality of thin film magnetic elements formed in a semiconductor integrated circuit, and permits random access to the respective thin film magnetic element.

In particular, recent announcement shows that the performance of the MRAM device is significantly improved by using thin film magnetic elements utilizing the magnetic tunnel junctions as memory cells.

It is common in memory devices to perform normal operations of reading and writing data and test operations based on program information stored therein in a nonvolatile manner. Typical program information for the normal operations includes one used for redundant configurations for replacement of defective memory cells with spare memory cells provided additionally.

For the test operations, typically, data used for a so-called built-in self-test (BIST) for internal testing of data write/read is stored as the program information. U.S. Pat. No. 6,347,056 B1 discloses a configuration to store program information for use in the BIST using MTJ memory cells.

In a conventional memory device, program information would be programmed by blowing fuse elements with laser or the like. As the configuration required special equipment such as a trimming device dedicated to laser blowing, enormous time and cost were spent for the programming process. In addition, such programming is commonly performed at a wafer level. Thus, once a memory device is packaged as a final product after defective addresses corresponding to defective memory cells detected at the wafer level have been programmed, it would be difficult to remedy any defects that occur to the packaged product, resulting in degradation of the yield.

Further, to program a large volume of program information, correspondingly a large number of fuse elements and others must be provided, leading to an increased area of circuit band for storage of the relevant program information.

The MTJ memory cell described above is advantageous in that it is capable of rewritable, nonvolatile data storage, and ensures a high degree of integration, so that a large volume of program information can be stored in a small area. U.S. Pat. No. 6,324,093 B1 discloses a configuration to perform nonvolatile data storage by destroying magnetic memory elements of the MTJ memory cells. Japanese Patent Laying-Open No. 2001-217398 discloses a configuration to store a large amount of information in a small area by storing multi-valued information in an area of one memory cell.

The MTJ memory cell, however, is disadvantageous in that, since it is a memory element utilizing the characteristic of thin film magnetic element that its electric resistance is changed according to a magnetization direction, data once programmed would be rewritten, or the program information would be lost, due to magnetic noise and others.

SUMMARY OF THE INVENTION

The present invention has been made to solve the above-described problems. An object of the present invention is to provide a configuration of thin film magnetic memory device which ensures efficient and stable storage of program information using magnetic memory elements the same as those included in normal memory cells.

A thin film magnetic memory device according to the present invention includes a plurality of memory cells and a program cell. The plurality of memory cells each store data magnetically. The program cell stores program information used for the plurality of memory cells. Each of the memory cells and the program cell includes a magnetic storage portion having an electric resistance value that changes according to a magnetization direction in accordance with a data write current. The program cell further includes a state change portion having an electric resistance value that fixedly changes from a first state to a second state in response to an access designation externally supplied.

In the thin film magnetic memory device of the present invention, each of the program cell and the memory cells includes the magnetic storage portion, and the program cell further includes the state change portion. That is, the program cell has the same structure as that of the memory cell, to which the state change portion is additionally provided. Accordingly, the program cell can be designed the same as the memory cell in terms of the magnetic storage portion and others, so that it can be provided efficiently.

Another thin film magnetic memory device according to the present invention includes a plurality of memory cells, and a program cell. The plurality of memory cells each store data magnetically. The program cell stores program information used for the plurality of memory cells. The program cell includes a plurality of state change portions and at least one access element. The plurality of state change portions each have an electric resistance changed in accordance with one of an externally supplied access designation and an applied magnetic field. The at least one access element each connects corresponding two of the state change portions in series with each other to a node to which a data read current is supplied at the time of data read.

The thin film magnetic memory device of the present invention includes the access element which connects corresponding two of the state change portions in series with each other to pass a data read current at the time of data read. Accordingly, it is possible to read out each program data corresponding to the electric resistance of each of the state change portions at a time. As a consequence, the time of data read can be reduced.

Yet another thin film magnetic memory device according to the present invention includes a plurality of memory cells each storing data magnetically, and a program cell. The program cell stores program information used for the plurality of memory cells. The program cell includes a plurality of state change portions and a plurality of access elements. The plurality of state change portions each have an electric resistance changed in accordance with one of an externally supplied access designation and an applied magnetic field. The plurality of access elements are provided corresponding to the plurality of state change portions, respectively, and each control electrical connection of the corresponding state change portion with one of a fixed voltage and a prescribed voltage. The plurality of state change portions are provided corresponding to respective pieces of program data constituting the program information. The plurality of state change portions are set to electric resistance values independently from each other.

In the thin film magnetic memory device of the present invention, the program unit includes a plurality of state change portions each having an electric resistance changed in response to one of the access designation and the applied magnetic field. Accordingly, the program unit can store program data of a plurality of bits, and thus, efficient data storage becomes possible.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
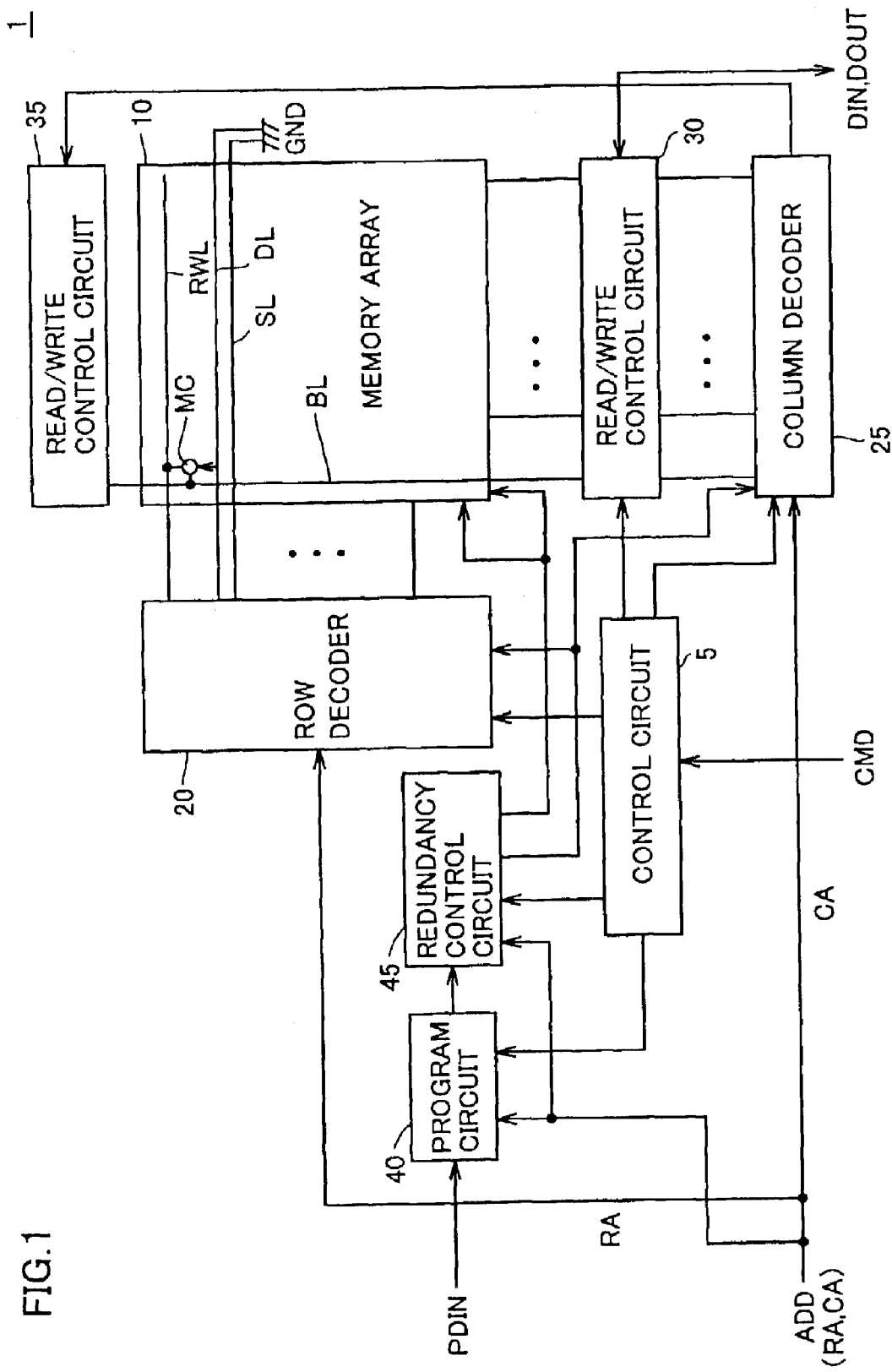
FIG. 1 is a schematic block diagram showing an entire configuration of the MRAM device according to an embodiment of the present invention.

Hereinafter, embodiments of the present invention are described in detail with reference to the drawings, throughout which the same or corresponding portions are denoted by the same reference characters, and description thereof will not be repeated.

First Embodiment

Referring to FIG. 1, the MRAM device 1 according to an embodiment of the present invention performs random access in accordance with a control signal CMD and an address signal ADD supplied externally, and performs input of write data DIN and output of read data DOUT.

MRAM device 1 is provided with a control circuit 5 for controlling the entire operation of MRAM device 1 in accordance with control signal CMD, and a memory array 10 having a plurality of MTJ memory cells arranged in rows and columns. Memory array 10 includes a plurality of normal MTJ memory cells arranged in rows and columns, each addressable by address signal ADD, and spare memory cells (not shown) for replacement of defective normal memory cells. In memory array 10, word lines, digit lines and source lines are arranged corresponding to respective memory cell rows, and bit lines are arranged corresponding to respective memory cell columns.

In FIG. 1, one memory cell MC is shown in memory array 10, and a word line RWL, a digit line DL and a source line SL corresponding to the row of memory cell MC, and a bit line BL corresponding to the column of memory cell MC, are shown.

Figure 2:
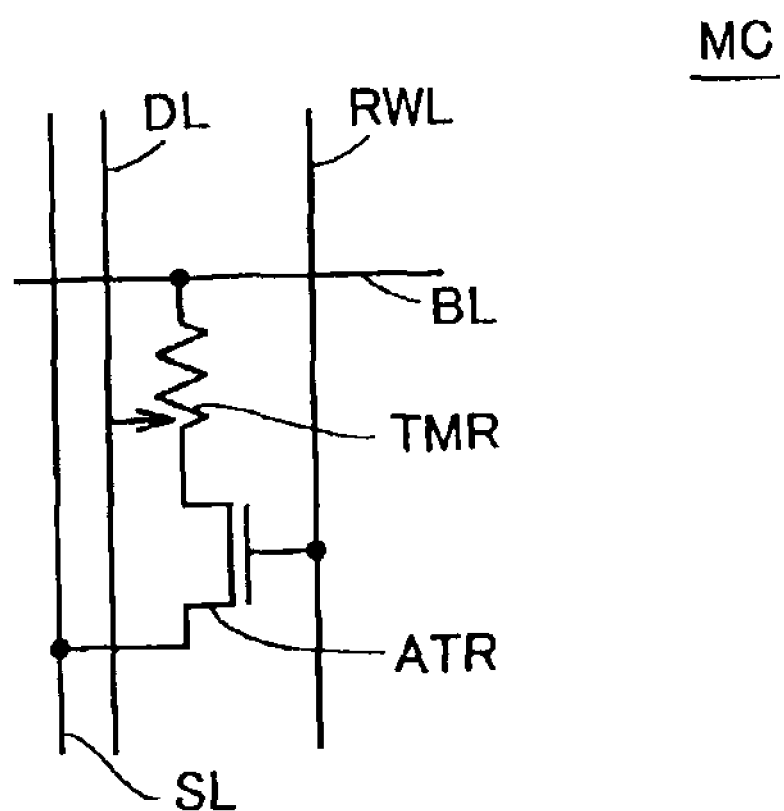
FIG. 2 is a schematic diagram showing a configuration of the MTJ memory cell having a magnetic tunnel junction portion.

Referring to FIG. 2, the MTJ memory cell MC having a magnetic tunnel junction portion (hereinafter, also simply referred to as "memory cell MC") includes a tunneling magneto-resistance element TMR having its electric resistance changed according to a data level of magnetically written stored data, and an access transistor ATR. Access transistor ATR is connected in series with tunneling magneto-resistance element TMR between bit line BL and source line SL. A field effect transistor formed on a semiconductor substrate is typically employed as access transistor ATR.

Memory cell MC is provided with bit line BL and digit line DL for passing data write currents therethrough in different directions from each other during data write, a word line RWL for designating data read, and source line SL for pulling down tunneling magneto-resistance element TMR to a ground voltage GND during the data read. On the data read, tunneling magneto-resistance element TMR is electrically coupled between source line SL and bit line BL, in response to turn-on of access transistor ATR.

Figure 3:
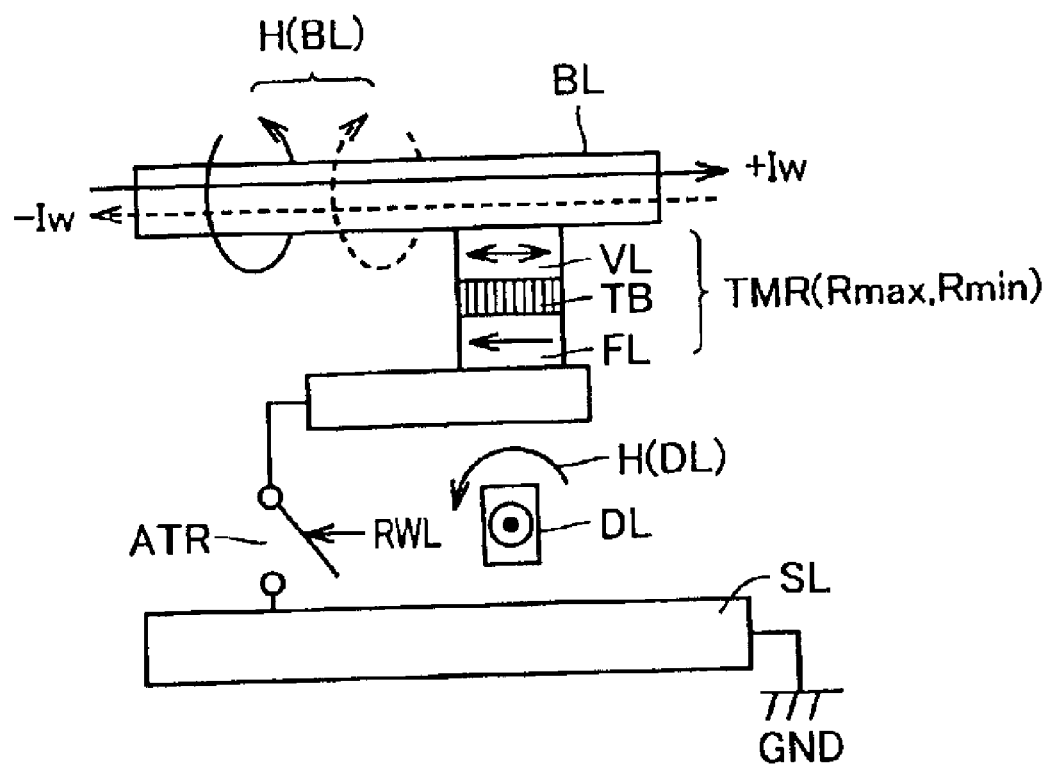
FIG. 3 is a conceptual diagram illustrating an operation of writing data to a memory cell.

Referring to FIG. 3, tunneling magneto-resistance element TMR has a ferromagnetic material layer having a fixed magnetization direction (hereinafter, also simply referred to as the "fixed magnetic layer") FL, and a ferromagnetic material layer magnetized in a direction in accordance with a magnetic field externally applied (hereinafter, also simply referred to as the "free magnetic layer") VL. A tunneling barrier (tunneling film) TB of an insulating film is provided between fixed magnetic layer FL and free magnetic layer VL. Free magnetic layer VL is magnetized in the same or opposite direction with respect to the magnetization direction of fixed magnetic layer FL, in accordance with a level of the stored data written therein. Fixed magnetic layer FL, tunneling barrier TB and free magnetic layer VL constitute the magnetic tunnel junction.

The electric resistance of tunneling magneto-resistance element TMR changes in accordance with a correlation of the magnetization directions of fixed magnetic layer FL and free magnetic layer VL. Specifically, the electric resistance of tunneling magneto-resistance element TMR becomes a minimal value Rmin when the magnetization directions of fixed magnetic layer FL and free magnetic layer VL are the same (parallel), whereas it becomes a maximal value Rmax when the magnetization directions of the relevant layers are opposite (anti-parallel).

At the time of data write, word line RWL is inactivated and access transistor ATR is turned off. In this state, the data write currents for magnetization of free magnetic layer VL flow in bit line BL and in digit line DL in the directions in accordance with the level of data to be written.

Figure 4:
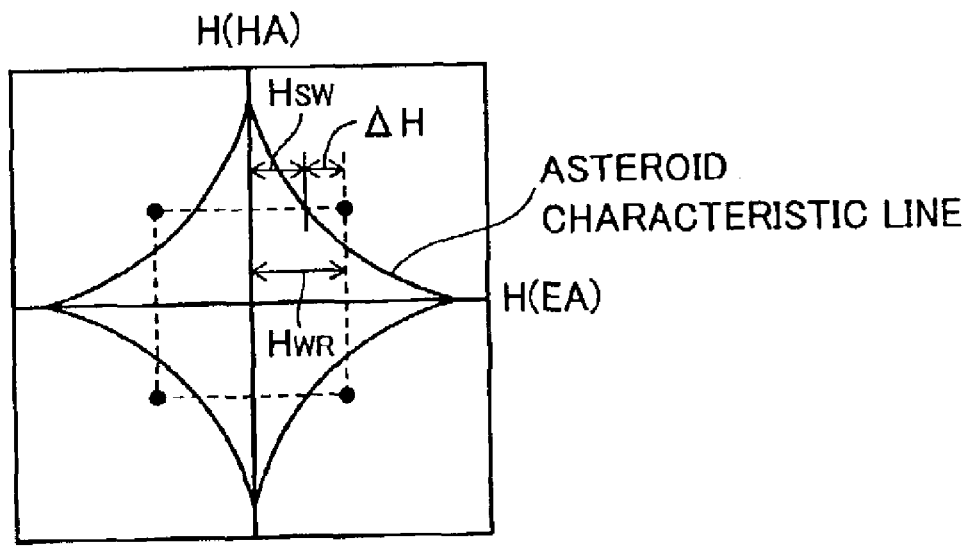
FIG. 4 is a conceptual diagram illustrating a relation between a data write current and a magnetization direction of the tunneling magneto-resistance element at the time of data write.

Referring to FIG. 4, the lateral axis H(EA) indicates a magnetic field being applied to free magnetic layer VL within tunneling magneto-resistance element TMR in an easy-to-magnetize axis (EA: Easy Axis) direction. The vertical axis H(HA) indicates a magnetic field acting on free magnetic layer VL in a hard-to-magnetize axis (HA: Hard Axis) direction. Magnetic fields H(EA) and H(HA) correspond to one and the other of two magnetic fields generated by the respective currents passed through bit line BL and digit line DL.

In memory cell MC, the fixed magnetization direction of fixed magnetic layer FL is along the easy axis direction of free magnetic layer VL. Free magnetic layer VL is magnetized along the easy axis direction in a direction parallel to or anti-parallel (opposite) to the magnetization direction of fixed magnetic layer FL, in accordance with a level ("1" or "0") of stored data. Memory cell MC can store one-bit data ("1" and "0") corresponding to the two magnetization directions of free magnetic layer VL.

The magnetization direction of free magnetic layer VL can be changed or rewritten only in the case where a sum of applied magnetic fields H(EA) and H(HA) reaches a region outside the asteroid characteristic line shown in FIG. 4. That is, the magnetization direction of free magnetic layer VL would not change if the magnetic fields applied for data write have an intensity that falls on the region inside the asteroid characteristic line.

As seen from the asteroid characteristic line, a magnetization threshold value necessary to change the magnetization direction along the easy axis can be lowered by applying the magnetic field to free magnetic layer VL in the hard axis direction. When an operating point at the time of data write is being designed as in the case of FIG. 4, the data write magnetic field in the easy axis direction in a memory cell MC to which data is to be written, is set to have an intensity of $H_{WR}$. That is, the data write current amount to be passed through bit line BL and/or digit line DL is adjusted to achieve the data write magnetic field $H_{WR}$. In general, data write magnetic field $H_{WR}$ is indicated by a sum of switching magnetic field $H_{SW}$ necessary for switching the magnetization direction and a margin $\Delta H$: $H_{WR} = H_{SW} + \Delta H$.

To rewrite the stored data in memory cell MC, or, the magnetization direction of tunneling magneto-resistance element TMR, the data write currents of not less than prescribed levels are passed through both digit line DL and bit line BL. Accordingly, free magnetic layer VL in tunneling magneto-resistance element TMR is magnetized in a direction parallel to or opposite (anti-parallel) to fixed magnetic layer FL, in accordance with the direction of data write magnetic field along the easy axis (EA). The magnetization direction written into tunneling magneto-resistance element TMR, or, the stored data in memory cell MC, is maintained in a non-volatile manner until data is newly written.

Figure 5:
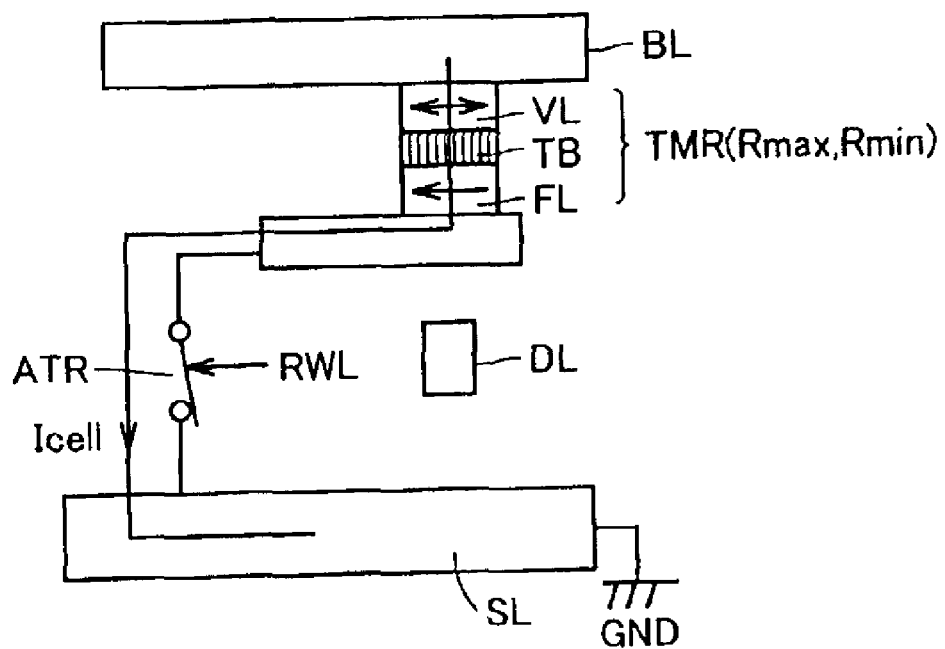
FIG. 5 is a conceptual diagram illustrating an operation of reading data from a memory cell.

Referring to FIG. 5, access transistor ATR turns on in a data read operation in response to activation of word line RWL. Thus, tunneling magneto-resistance element TMR is electrically coupled to bit line BL, while being pulled down to ground voltage GND.

In this state, when bit line BL is pulled up to a prescribed voltage, a memory cell current Icell corresponding to the electric resistance of tunneling magneto-resistance element TMR, or, the level of stored data in memory cell MC, is passed through a current path including bit line BL and tunneling magneto-resistance element TMR. The stored data can be read out of memory cell MC by comparing the memory cell current Icell with a prescribed reference current, for example.

Generally, memory cell current Icell is set one or two digits smaller than the data write current described above. Thus, it is unlikely that the stored data of memory cell MC is erroneously rewritten by memory cell current Icell. Thus, non-destructive data read is ensured.

Figure 6:
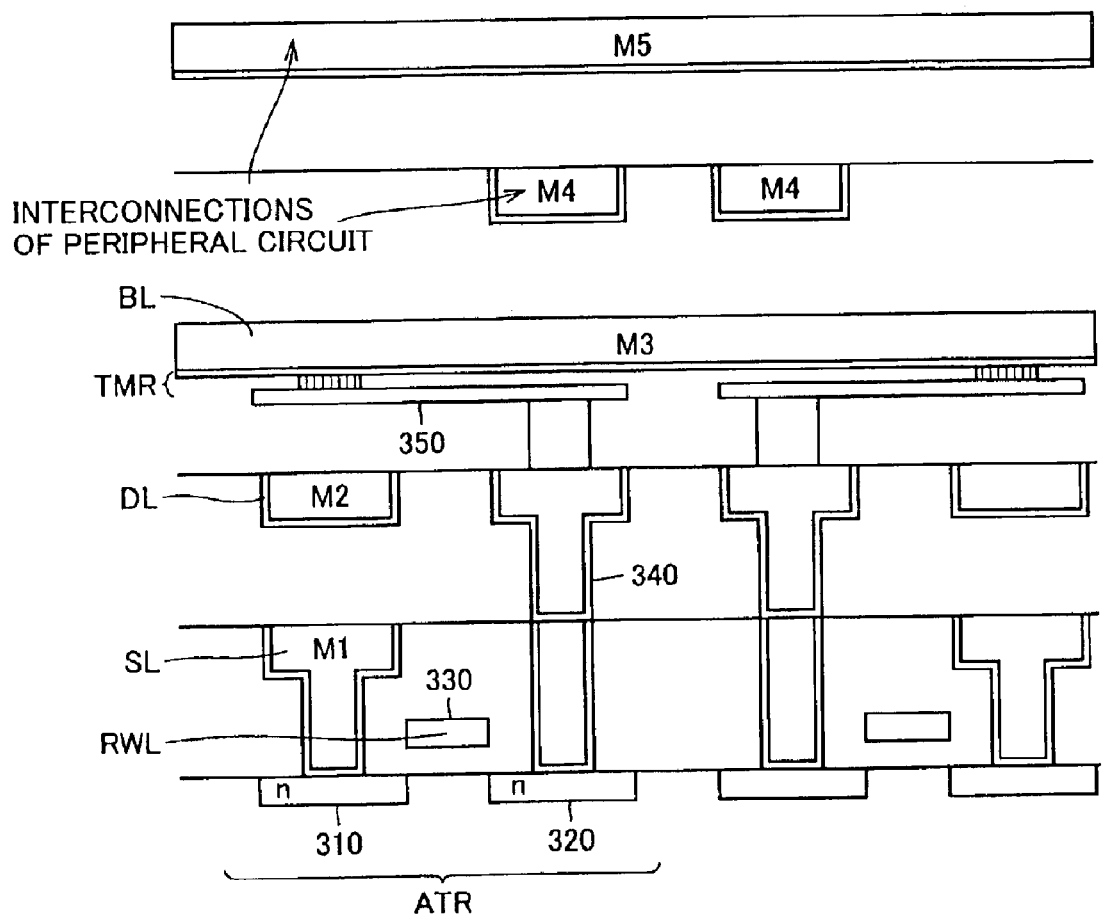
FIG. 6 is a cross sectional view of a memory cell included in a memory array formed on a semiconductor substrate.

Referring to FIG. 6, access transistor ATR of memory cell MC included in memory array 10 formed on the semiconductor substrate has n-type impurity regions 310 and 320, and a gate region 330. Impurity region 310 is electrically coupled to source line SL of a first metal interconnection layer M1 via a metal film formed in a contact hole.

Digit line DL is formed in a metal interconnection layer M2 provided in an upper layer of source line SL. Tunneling magneto-resistance element TMR is arranged on an upper side of digit line DL. Tunneling magneto-resistance element TMR is electrically coupled to impurity region 320 of access transistor ATR via a strap 350 and a metal film formed in a contact hole 340. Strap 350 is provided to electrically couple tunneling magneto-resistance element TMR with access transistor ATR, and is formed of a conductive material. Bit line BL is provided on an upper side of tunneling magneto-resistance element TMR, and is electrically coupled thereto.

Bit line BL through which a data write current and a data read current are passed and digit line DL through which the data write current is passed, are formed using metal interconnection layers M3 and M2, respectively. By comparison, word line RWL, provided to control a gate voltage of access transistor ATR, does not need to actively pass a current therethrough. Thus, from the standpoint of higher integration, word line RWL is generally formed of a polysilicon layer or a polycide layer in the same interconnection layer as gate region 330, instead of being formed in an additionally provided metal interconnection layer. Metal interconnection layers M4, M5 provided on an upper side of bit line BL are employed to provide other signal lines for use in a peripheral circuit, such as data lines for transmission of read data and write data.

Based on the configuration as described above, memory cells MC are integrally arranged to form a memory array of large capacity, to carry out nonvolatile data storage.

Referring again to FIG. 1, MRAM device 1 is further provided with a row decoder 20, a column decoder 25 and read/write control circuits 30, 35.

Row decoder 20 performs row selection in memory array 10 in accordance with a row address RA indicated by address signal ADD. Column decoder 25 performs column selection in memory array 10 in accordance with a column address CA indicated by address signal ADD. Row decoder 20 includes a driver (not shown) driving word line RWL and digit line DL, and selectively activates word line RWL or digit line DL selected based on the row selection result of row decoder 20. Row address RA and column address CA indicate a memory cell designated as a target of data read or data write (hereinafter, also referred to as the "selected memory cell").

Read/write control circuits 30, 35 collectively represent circuit groups that are arranged in the vicinity of memory array 10 for passing the data write current and the sense current (data read current) through bit line BL of a selected memory cell column (hereinafter, also referred to as the "selected column") corresponding to the selected memory cell upon data read and data write.

MRAM device 1 is further provided with a program circuit 40 and a redundancy control circuit 45. Program circuit 40 stores program information in a non-volatile manner in response to externally supplied program data PDIN, as will be described later in detail.

In the first embodiment, a configuration of program circuit 40 which stores a defective address specifying a defective memory cell as program information is described representatively.

Redundancy control circuit 45, in a normal operation, compares address signal ADD with a defective address held in program circuit 40, to determine whether a defective memory cell has been selected as a target of data read or data write.

When it is determined that the defective memory cell has been selected, redundancy control circuit 45 designates access to a redundant circuit formed of spare memory cells at the same time as it designates row decoder 20 and column decoder 25 to stop the access to the selected memory cell designated by externally supplied address signal ADD. Thus, the data read or data write is performed on a redundant memory cell instead of the selected memory cell designated by address signal ADD.

When address signal ADD externally supplied does not match the defective address, row decoder 20 and column decoder 25 perform normal select operations, and the data read or data write is performed on the selected, normal memory cell.

In the first embodiment, write and read of program data as the program information stored in program circuit 40 will be described in detail.

Figure 7:
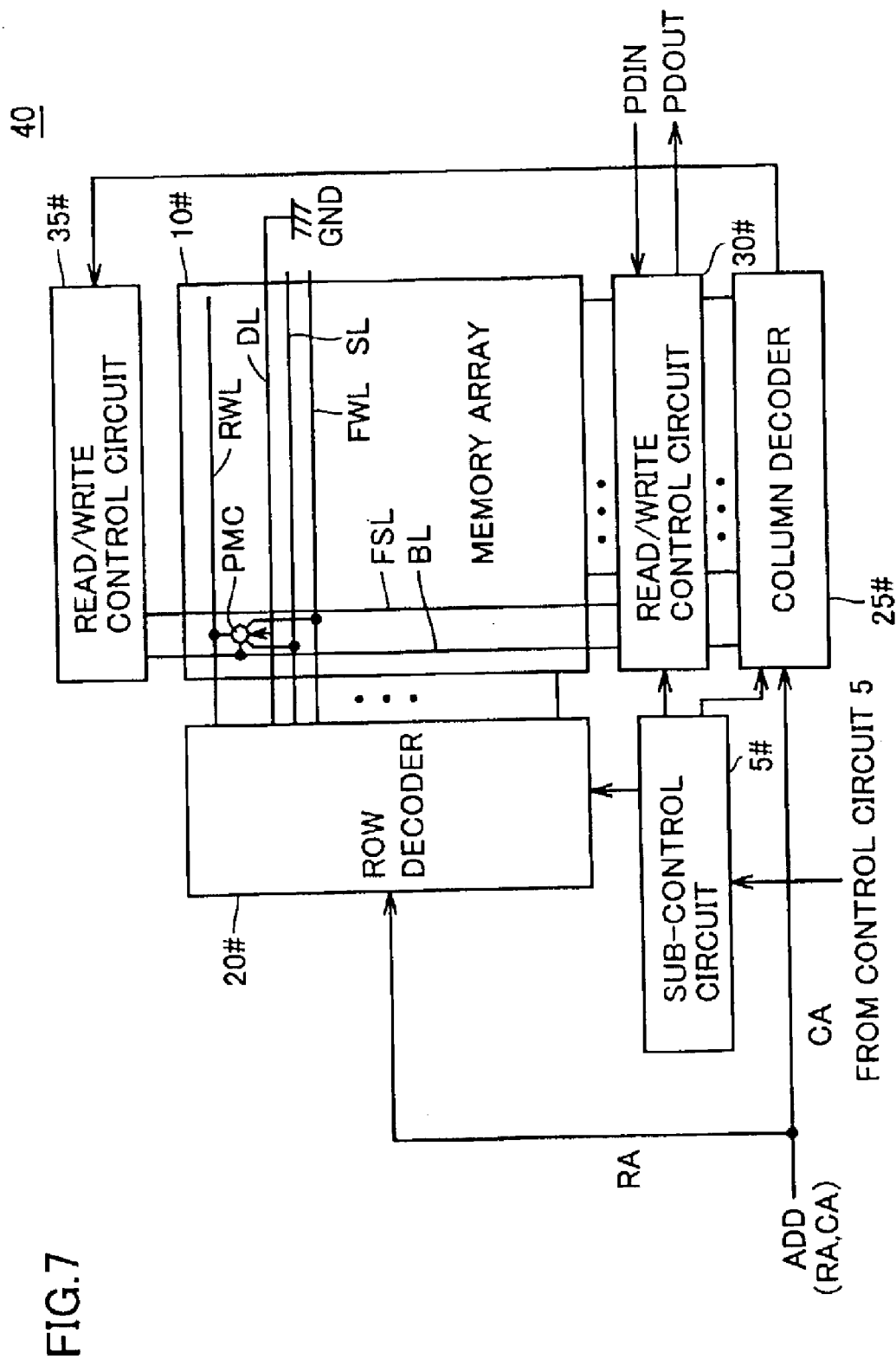
FIG. 7 is a conceptual diagram of a program circuit according to a first embodiment of the present invention.

Referring to FIG. 7, program circuit 40 according to the first embodiment has approximately the same configuration as the MRAM device 1 shown in FIG. 1, except that program circuit 40 and redundancy control circuit 45 are eliminated therefrom. Specifically, program circuit 40 performs random access in accordance with a control signal from a control circuit 5 and address signal ADD, and performs input of program data PDIN and output of program read data PDOUT.

Program circuit 40 includes: a sub-control circuit 5# which controls the entire operations of program circuit 40 in response to an operation designation from control circuit 5; a memory array 10# which has a plurality of MTJ memory cells PMC (hereinafter, also simply referred to as "memory cells PMC") arranged in rows and columns and storing program information; a row decoder 20# which performs row selection in memory array 10# in accordance with a row address RA indicated by address signal ADD; a column decoder 25# which performs column selection in memory array 10# in accordance with a column address CA indicated by address signal ADD; and read/write control circuits 30#, 35#.

Read/write control circuits 30#, 35# collectively represent circuit groups that are arranged in the vicinity of memory array 10#, for passing the data write current and the sense current through bit line BL of a selected column corresponding to a selected memory cell upon data read and data write.

Memory array 10# has memory cells PMC for storage of program information integrally arranged in rows and columns. Memory array 10# also has word lines RWL, FWL, digit lines DL and source lines SL provided corresponding to the memory cell rows, and bit lines BL and source lines FSL provided corresponding to the memory cell columns. One memory cell PMC is shown in FIG. 7 with word lines RWL, FWL and source line SL corresponding to its row, and bit line BL and source line FSL corresponding to its column. Word lines RWL, FWL, source lines SL, FSL, digit line DL, and bit line BL collectively represent plural lines of respective word lines, source lines, digit lines, and bit lines.

Figure 8:
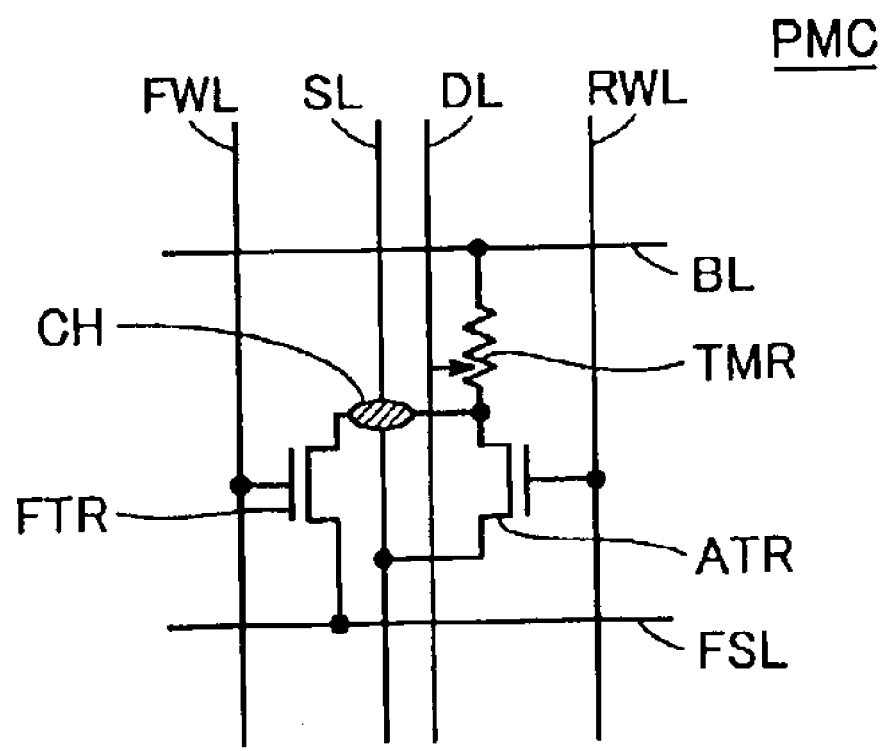
FIG. 8 is a circuit configuration diagram showing in detail a memory cell in the program circuit storing program information according to the first embodiment.

Referring to FIG. 8, memory cell PMC storing program information according to the first embodiment differs from memory cell MC shown in FIG. 2 in that it further includes an access transistor FTR, and a connect portion CH for use in connection between tunneling magneto-resistance element TMR and access transistor FTR. Memory cell PMC is capable of nonvolatile data storage of two bits.

Tunneling magneto-resistance element TMR and access transistor FTR are connected in series between bit line BL and source line FSL via connect portion CH, and access transistor FTR has its gate electrically coupled to word line FWL.

Here, connect portion CH is formed of a conductive material having its state changed according to a current passed therethrough. The electrical connection between tunneling magneto-resistance element TMR and access transistor FTR is changed, based on the current passed through connect portion CH, to a hardly connected, or substantially disconnected, state of a high resistance state. Thus, fixed (nonvolatile) data storage of one bit is performed by correlating the disconnected/non-disconnected state (also referred to as the "programmed/non-programmed state") of connect portion CH with the stored data of "0" and "1".

Memory cell PMC constitutes a program element which stores data of two bits based on the tunneling magneto-resistance element TMR storing data by a magnetization direction and also based on the disconnected/non-disconnected state of connect portion CH described above.

Figure 9:
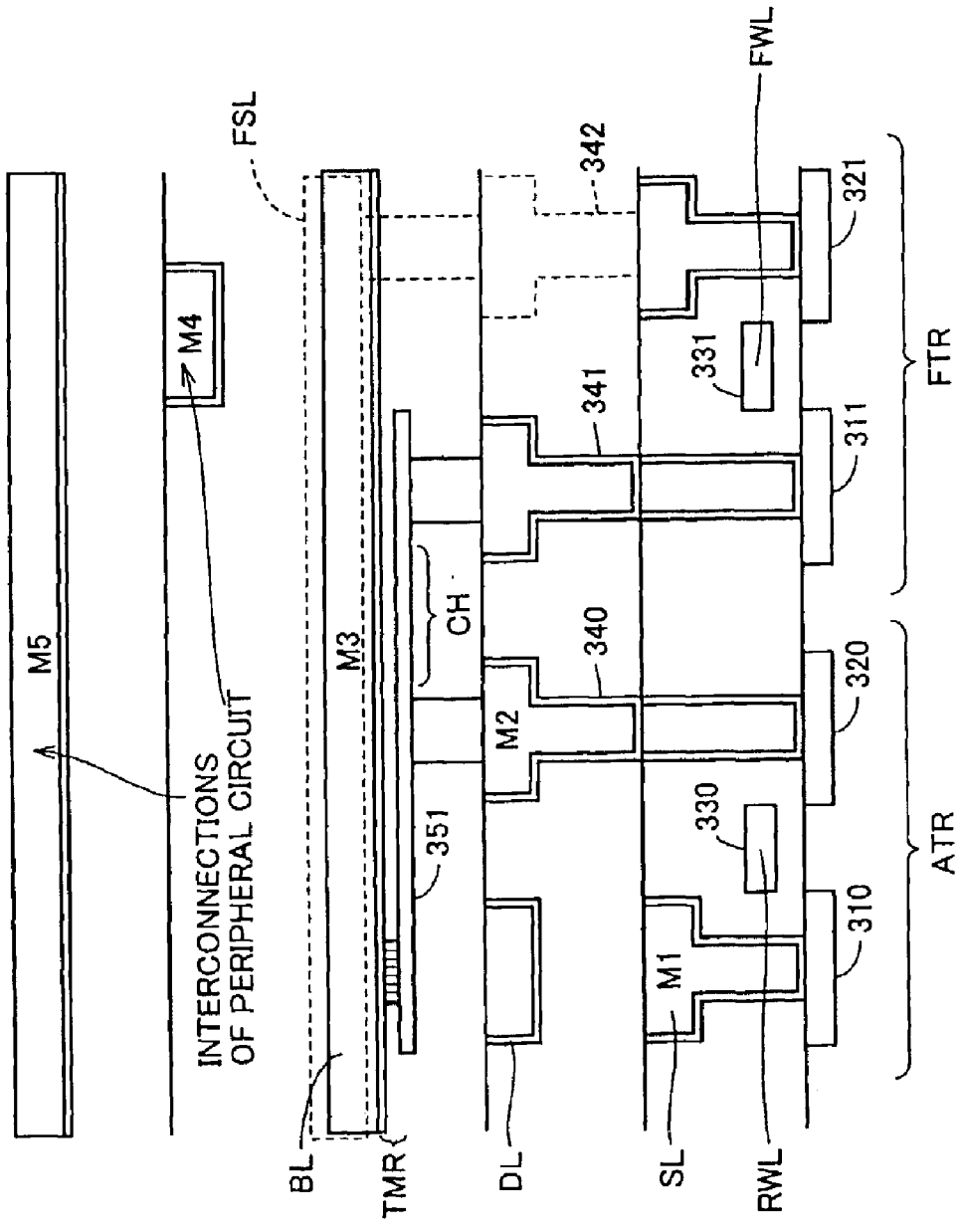
FIG. 9 is a cross sectional view of the memory cell in the program circuit included in a memory array formed on the semiconductor substrate.

Referring to FIG. 9, the cross sectional view of memory cell PMC included in memory array 10# formed on the semiconductor substrate is identical to that of memory cell MC shown in FIG. 6, except for the configurations of access transistor FTR, connect portion CH, source line FSL and word line FWL, and thus, detailed description of the common portions are not repeated. Access transistor FTR is formed on the semiconductor substrate adjacent to access transistor ATR, and has n-type impurity regions 311 and 321, and a gate region 331. Impurity region 311 is electrically coupled to a strap 351 via a metal film formed in a contact hole 341. Strap 351 is electrically coupled to tunneling magneto-resistance element TMR. Here, connect portion CH corresponds to a portion of strap 351 which is extended compared to strap 350 in FIG. 3 for electrical coupling with access transistor FTR. This connect portion CH corresponding to a portion of strap 351 can be designed into a narrow shape to promote localization of the current, as a way of causing the portion to change its state (shape) based on the current passed therethrough.

Source line FSL and bit line BL are provided in the same metal interconnection layer (M3) in parallel with each other, while short-circuit therebetween being prevented. Source line FSL is electrically coupled to impurity region 321 of access transistor FTR via a metal film formed in a contact hole 342. Specifically, contact hole 342 is provided with a metal layer in a row direction (the same direction as the word lines and others) in the region of the first metal interconnection layer, and is electrically coupled to source line FSL in the upper layer through a path indicated by a dotted line to prevent short-circuit with bit line BL. Word line WL is formed of a polysilicon layer or a polycide layer in the same layer as gate region 331, without provision of an additional metal interconnection layer, from the standpoint of higher integration, as described above.

As such, memory cell PMC has approximately the same configuration as memory cell MC, and can be designed without provision of an additional metal interconnection layer. This ensures a higher degree of integration and a lower manufacturing cost thereof, thereby enabling efficient designing of the program elements.

Hereinafter, data write and data read of program information with respect to integrally arranged memory cells PMC as described above is described in detail.

Figure 10:
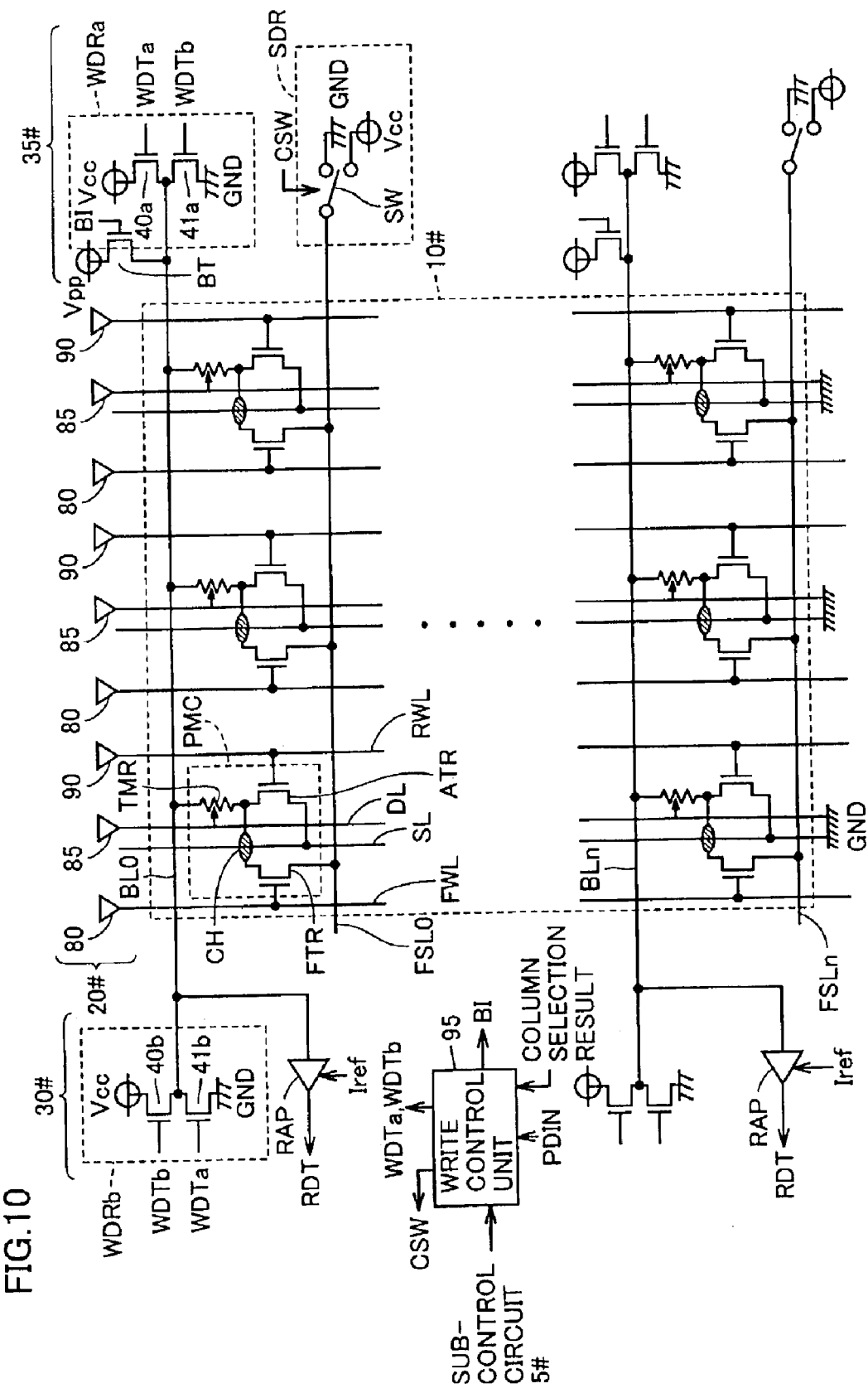
FIG. 10 is a circuit configuration diagram of the memory array and its peripheral region in the program circuit according to the first embodiment.

Referring to FIG. 10, memory array 10# according to the first embodiment has a plurality of memory cells PMC arranged in rows and columns. As described above, memory array 10# is provided with a plurality of word lines FWL, RWL and a plurality of source lines SL corresponding to memory cell rows and a plurality of bit lines BL and a plurality of source lines FSL corresponding to memory cell columns.

In FIG. 10, bit lines BL0–BLn and source lines FSL0–FSLn provided corresponding to the memory cell columns are shown by way of example. Connections between memory cell PMC and bit line BL, source lines SL, FSL and word lines RWL, FWL are as described in conjunction with FIG. 8, and thus, description thereof is not repeated.

Row decoder 20# includes a word line driver 80 provided corresponding to word line FWL, a digit line driver 85 provided corresponding to digit line DL, and a word line driver 90 provided corresponding to word line RWL, arranged for each memory cell row.

Read/write control circuit 30# includes: a bit line driver WDRb which is provided corresponding to an end of respective bit line BL and drives the corresponding bit line BL to one of a power supply voltage Vcc and a ground voltage GND in accordance with write control signals WDTa, WDTb; and a write control unit 95 which generates write control signals WDTa, WDTb, a control signal CSW or a control signal BI corresponding to program data PDIN at the time of data write in response to a designation of sub-control circuit 5#. Bit line driver WDRb includes a transistor 40b which is arranged between power supply voltage Vcc and the end of bit line BL and has its gate receiving an input of write control signal WDTb, and a transistor 41b which is arranged between ground voltage GND and the end of bit line BL and has its gate receiving an input of write control signal WDTa.

Read/write control circuit 30# further includes an amplifier RAP which is provided for each bit line and generates read data RDT based on a data read current supplied to the bit line. A read control circuit (not shown) receives an input of read data RDT and outputs program read data PDOUT.

Read/write control circuit 35# includes: a bit line driver WDRa which is provided corresponding to the other end of respective bit line BL and drives the corresponding bit line BL to one of power supply voltage Vcc and ground voltage GND in accordance with write control signals WDTa, WDTb; and a source line driver SDR which drives one of power supply voltage Vcc and ground voltage GND to source line FSL in accordance with control signal CSW. Bit line driver WDRa includes a transistor 40a which is arranged between power supply voltage Vcc and the other end of bit line BL and has its gate receiving an input of write control signal WDTa, and a transistor 41a which is provided between ground voltage GND and the other end of bit line BL and has its gate receiving an input of write control signal WDTb.

Source line driver SDR has a switch element SW, and supplies power supply voltage Vcc to source line FSL in response to control signal CSW (of an "H" level) and supplies ground voltage GND to source line FSL in response to control signal CSW (of an "L" level), for example.

Read/write control circuit 35# further includes a transistor BT which is provided for each bit line and electrically connects the corresponding bit line to a boosted voltage Vpp, higher than power supply voltage Vcc, in response to control signal BI.

Firstly, data write of program data to tunneling magneto-resistance element TMR is described. Hereinafter, normal data write to tunneling magneto-resistance element TMR is referred to as the MTJ write mode.

It is assumed that, in the MTJ write mode for memory cells PMC according to the first embodiment, program information is written in a unit of selected memory cell row. In this example, the case of writing program data "0" to the memory cell PMC corresponding to bit line BL0 and writing program data "1" to the memory cell PMC corresponding to bit line BLn is described.

Figure 11:
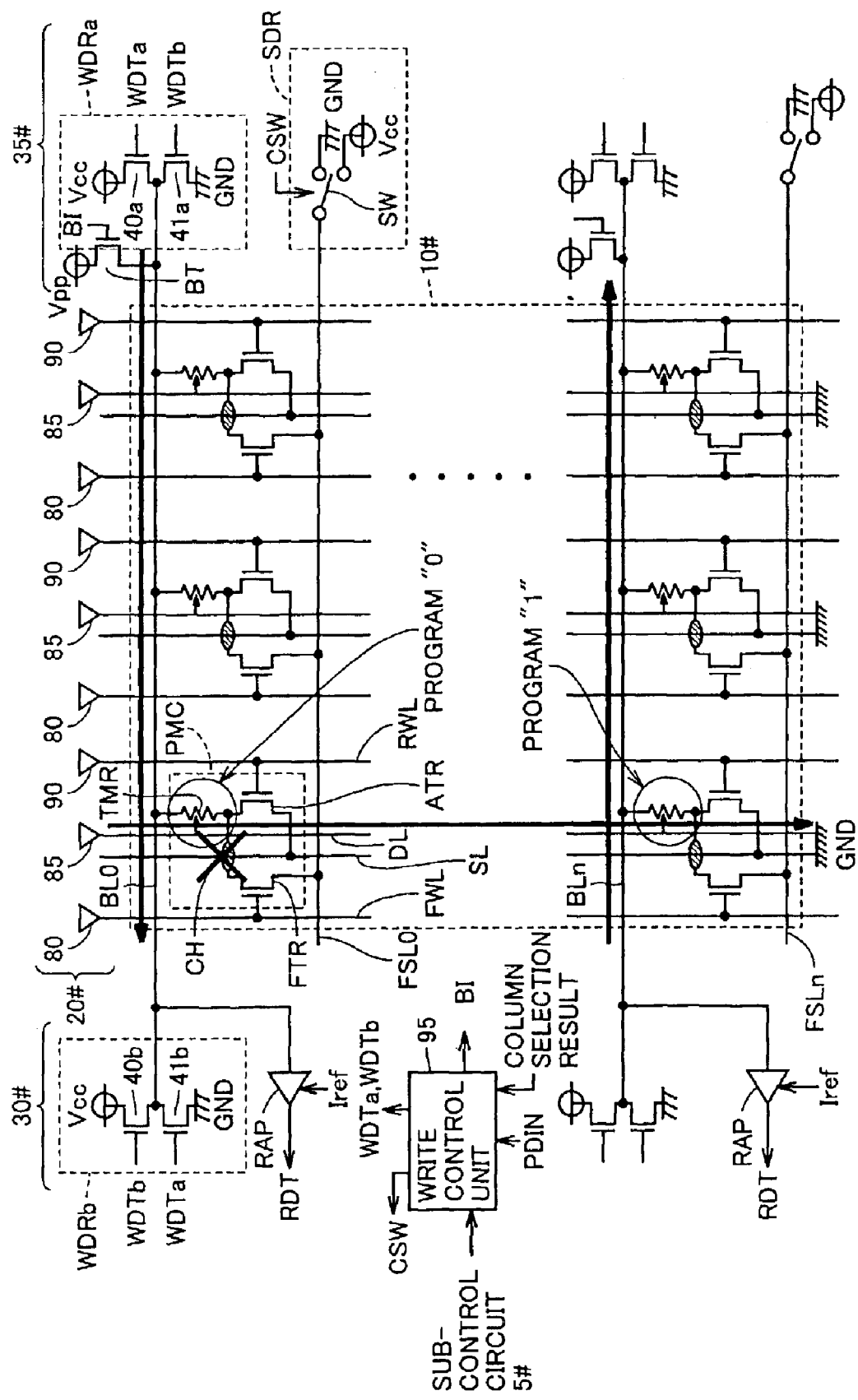
FIG. 11 is a conceptual diagram illustrating the case of performing an MTJ write mode on the memory cell according to the first embodiment.

Referring to FIG. 11, write control unit 95 sets write control signals WDTa, WDTb to be input to bit line drivers WDRa and WDRb provided for each column, based on program data PDIN. Specifically, it sets one and the other of write control signals WDTa, WDTb to be input to corresponding bit line drivers WDRa and WDRb to an "H" level and an "L" level, based on the program data PDIN, the column selection result of column decoder 25#, and the operation designation of the MTJ write mode from sub-control circuit 5#. Here, by way of example, write control signal WDTa of an "H" level and write control signal WDTb of an "L" level are set for bit line drivers WDRa and WDRb corresponding to bit line BL0. Further, write control signal WDTa of an "L" level and write control signal WDTb of an "H" level are set for bit line drivers WDRa and WDRb corresponding to bit line BLn. It is assumed that, in each of bit line drivers WDRa and WDRb, write control signals WDTa and WDTb thus set are latched by a latch circuit (not shown).

Correspondingly, transistor 40a turns on in bit line driver WDRa corresponding to bit line BL0, and power supply voltage Vcc and the other end of bit line BL0 are electrically coupled. Further, transistor 41b in bit line driver WDRb turns on to electrically couple the one end of bit line BL0 to ground voltage GND.

Thus, a current path from the other end to the one end of bit line BL0 is formed, and a data write current corresponding to program data "0" is supplied to bit line BL0.

For bit line BLn, a current path from the one end to the other end of bit line BLn is formed, and a data write current corresponding to program data "1" is supplied to bit line BLn, in the same manner as in bit line BL0.

Approximately at the same timing, row decoder 20# selectively activates digit line driver 85 in response to row address RA, to supply the data write current to the corresponding digit line.

With the data write currents supplied to bit lines BL0 and BLn and the data write current passed through digit line DL, the magnetization directions of tunneling magneto-resistance elements TMR in memory cells PMC in the selected memory cell row are set in accordance with the data write currents, and program data can be stored in the selected memory cells in accordance with the magnetization directions. In this example, program data "0" can be stored in tunneling magneto-resistance element TMR in memory cell PMC corresponding to bit line BL0, and program data "1" can be stored in tunneling magneto-resistance element TMR of memory cell PMC corresponding to bit line BLn.

Now, data read of program data stored in tunneling magneto-resistance element TMR is described. Hereinafter, data read of program data stored in tunneling magneto-resistance element TMR is also referred to as the MTJ read mode.

It is assumed that, in the MTJ read mode for memory cells PMC according to the first embodiment, program information is read in units of memory cell rows. In this example, the case of reading data from memory cell PMC corresponding to bit line BL0 storing program data "0" and from memory cell PMC corresponding to bit line BLn storing program data "1", is described.

Figure 12:
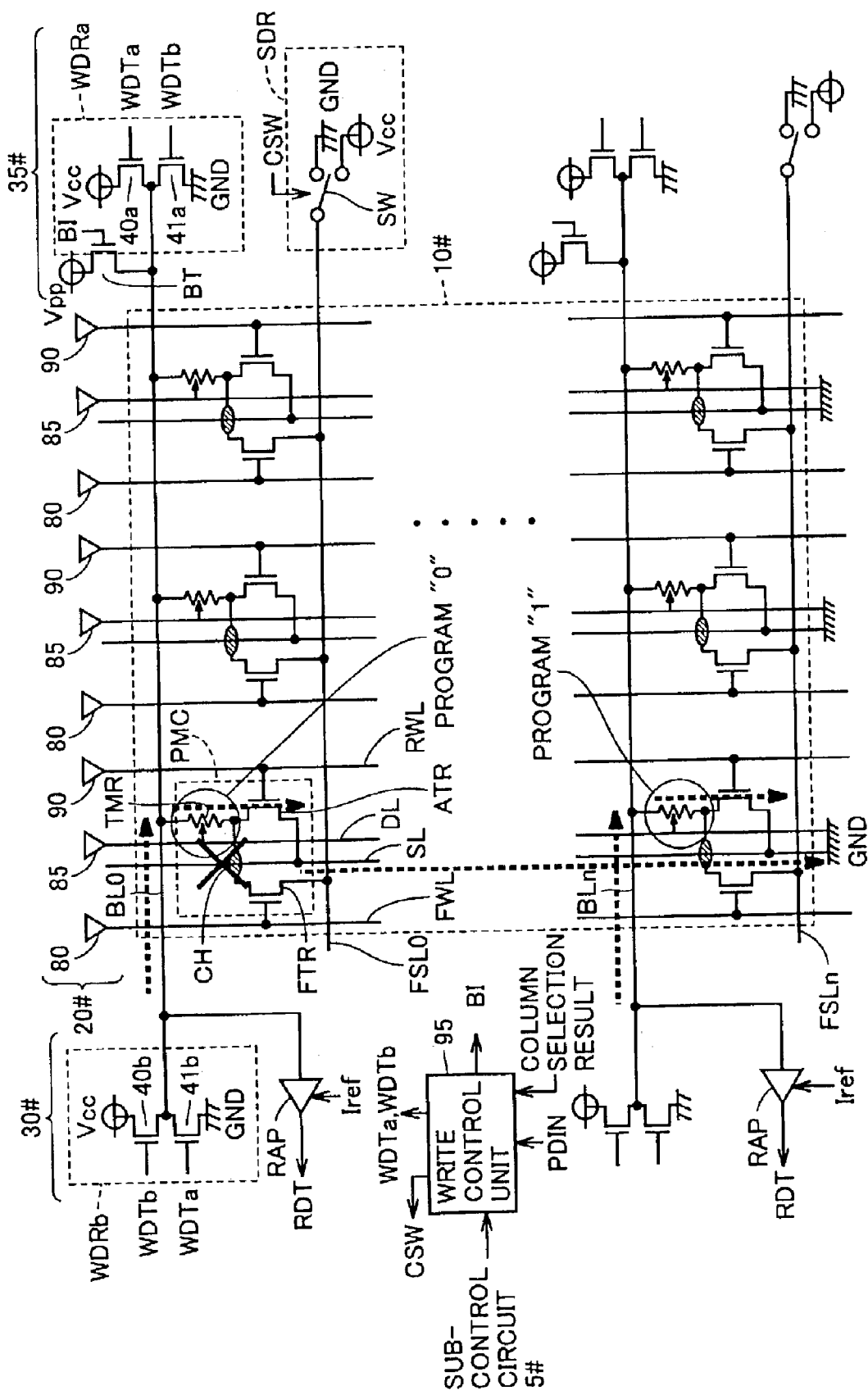
FIG. 12 is a conceptual diagram illustrating the case of performing an MTJ read mode on the memory cell according to the first embodiment.

Referring to FIG. 12, in the MTJ read mode, row decoder 20# selectively activates word line RWL in response to row address RA. Correspondingly, each access transistor ATR having its gate electrically coupled to activated word line RWL turns on.

Next, in the MTJ read mode, an amplifier RAP provided for each column is activated in response to an operation designation of the MTJ read mode from sub-control circuit 5#, and pulls up the corresponding bit line to a prescribed voltage.

Correspondingly, a current path is formed from amplifier RAP, bit line BL, tunneling magneto-resistance element TMR, access transistor ATR to source line SL (GND). That is, through this current path, a data read current corresponding to the electric resistance (Rmax, Rmin) of tunneling magneto-resistance element TMR is supplied from amplifier RAP to the selected memory cell. Amplifier RAP outputs program data stored in tunneling magneto-resistance element TMR as read data RDT, based on comparison of the relevant data read current with a reference current Iref that would be generated by a resistance value of an intermediate level of electric resistance values Rmax and Rmin with respective to a prescribed voltage. Specifically, amplifier RAP corresponding to bit line BL0 outputs read data RDT corresponding to program data "0", and amplifier RAP corresponding to bit line BLn outputs read data RDT corresponding to program data "1".

In a common MTJ memory cell, the electric resistance value is in the order of some tens of KΩ, and a voltage to be applied to tunneling magneto-resistance element TMR upon data read must be set taking account of reliability of tunneling film (insulating film) and others. Specifically, a tunneling film having a thickness of 150 μm will be broken with an applied voltage of 1V. Thus, the voltage applied to the relevant tunneling film is restricted to the order of 0.5V. As such, it is necessary to set a prescribed voltage to be pulled up at the time of data read to prevent breakdown of the tunneling film.

Although the case of performing the MTJ read mode on the memory cells constituting the selected memory cell row in parallel with each other has been described in the present example, not limited thereto, the MTJ read mode can be performed on one selected memory cell. In this regard, for carrying out the MTJ read mode on one selected memory cell, it may be configured such that a current path is formed with one common amplifier, instead of the amplifiers RAP arranged for respective memory cell columns as described above. This can reduce the number of parts in the circuit.

Now, data write of program data to connect portion CH in memory cell PMC is described. Hereinafter, the data write to connect portion CH of memory cell PMC is also referred to as the fuse blow mode.

It is assumed that, in the fuse blow mode for memory cells PMC according to the first embodiment, program information is written in units of memory cell rows. In this example, the case of setting memory cell PMC corresponding to bit line BL0 to a programmed state (corresponding to program data "0") and setting memory cell PMC corresponding to bit line BLn to a non-programmed state (corresponding to program data "1") is described.

Figure 13:
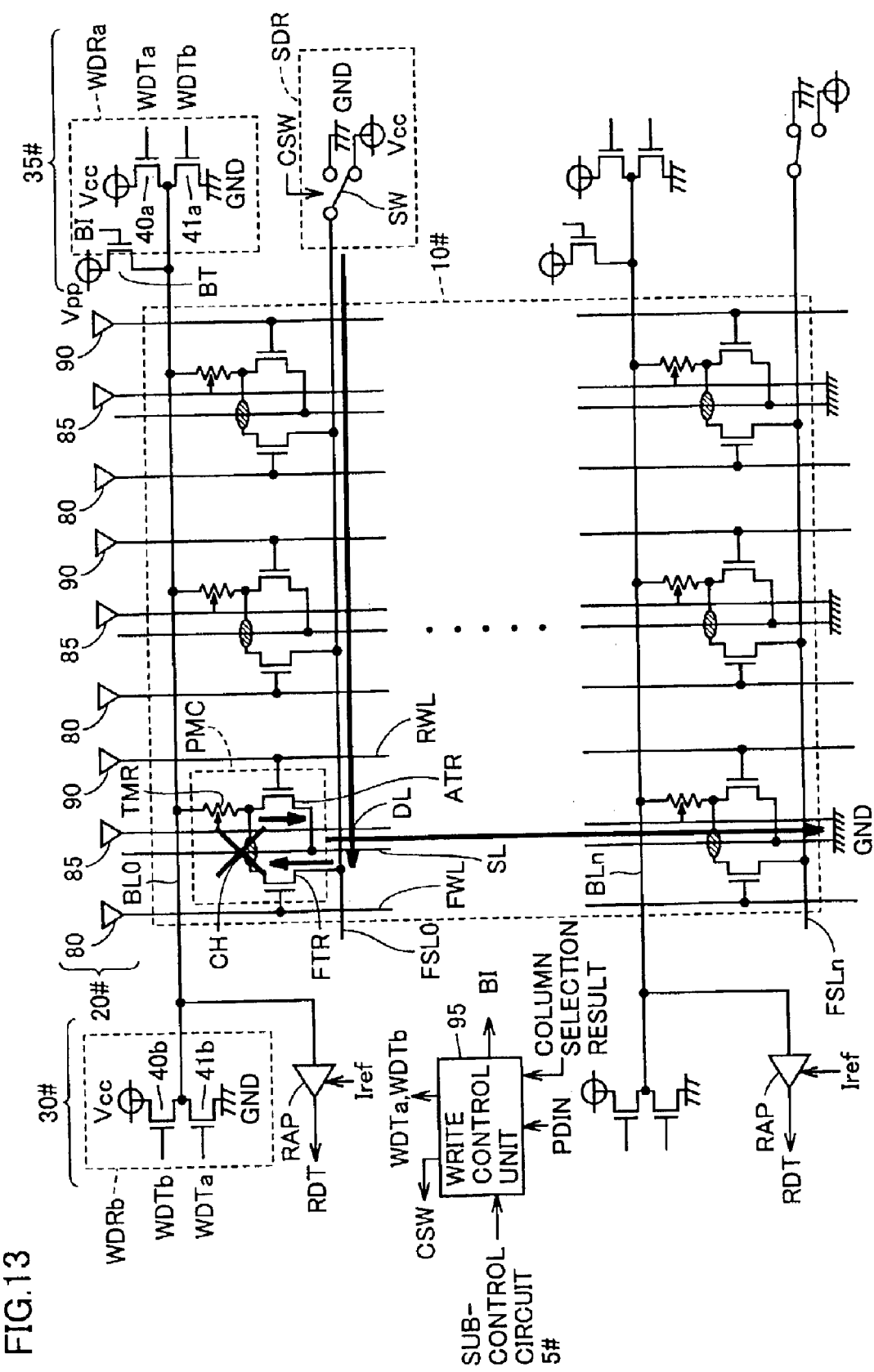
FIG. 13 is a conceptual diagram illustrating the case of performing a fuse blow mode on the memory cell according to the first embodiment.

Referring to FIG. 13, write control unit 95, in the fuse blow mode, outputs control signal CSW to source line driver SDR provided for respective memory cell column, in response to program data PDIN, the column selection result of column decoder 25# and the operation designation of the fuse blow mode from sub-control circuit 5#. Control signal CSW thus set is latched by a latch circuit (not shown) in each source line driver SDR.

It is assumed by way of example that write control unit 95 outputs control signal CSW of an "H" level to source line driver SDR corresponding to bit line BL0 in response to program data PDIN ("0") and outputs control signal CSW of an "L" level to source line driver SDR corresponding to bit line BLn in response to program data PDIN ("1"). Source line FSL0 is electrically coupled to power supply voltage Vcc in response to control signal CSW of the "H" level, and source line FSLn is electrically coupled to ground voltage GND in response to control signal CSW of the "L" level.

Approximately at the same timing, row decoder 20 selectively activates (to an "H" level) word lines FWL and RWL corresponding to the memory cell row in accordance with the input of row address RA. Correspondingly, access transistors FTR, ATR corresponding to activated word lines FWL, RWL turn on.

Thus, a current path is formed from source line driver SDR (power supply voltage Vcc), source line FSL, access transistor FTR, connect portion CH, access transistor ATR, to ground voltage GND, or, a prescribed current is supplied to connect portion CH via the two access transistors. Correspondingly, connect portion CH changes the electric connect state between access transistor ATR and tunneling magneto-resistance element TMR in response to the prescribed current passed therethrough, as described above. Specifically, the electric connect state between access transistor ATR and tunneling magneto-resistance element TMR attains a substantially disconnected state, and the load resistance (electric resistance) of the connect portion makes a transition from a low resistance state of some $\Omega$ to a high resistance state of some hundreds of M (mega) $\Omega$.

Such a transition of the load resistance of connect portion CH from some $\Omega$ to some hundreds of M$\Omega$ enables fixed storage of program information. For example, program data "0" is stored when connect portion CH is in the substantially disconnected state or the high resistance state, and program data "1" is stored when connect portion CH is in the non-disconnected state or the low resistance state.

Now, data read of data programmed in connect portion CH of memory cell PMC is described. Hereinafter, the data read from connect portion CH of memory cell PMC is also referred to as the fuse read mode.

It is assumed that program information is read in units of memory cell rows in the fuse read mode for memory cells PMC according to the first embodiment. In this example, the case of reading data of memory cell PMC corresponding to bit line BL0 in the programmed state and reading data of memory cell PMC corresponding to bit line BLn in the non-programmed state, is described.

Figure 14:
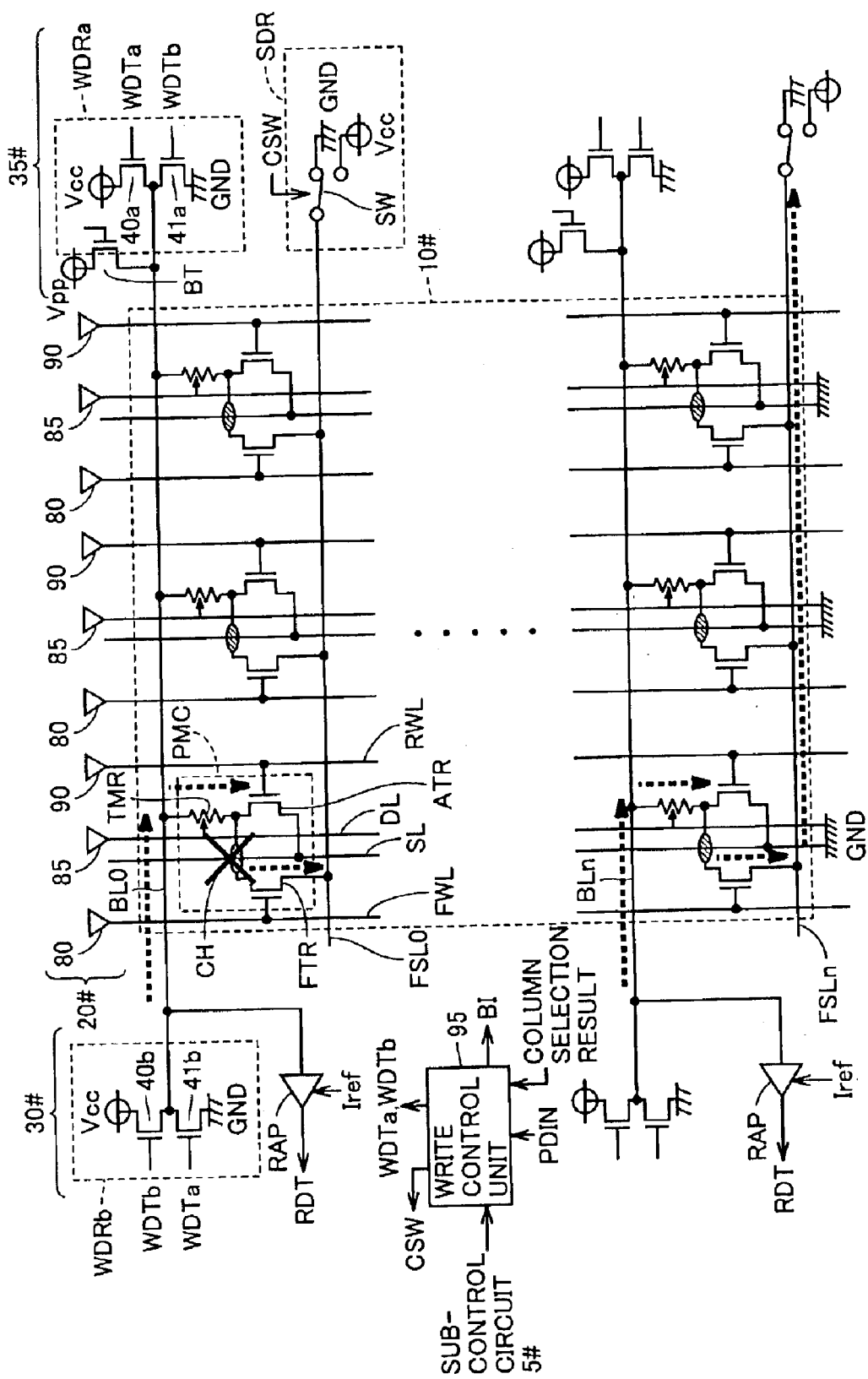
FIG. 14 is a conceptual diagram illustrating the case of performing a fuse read mode on the memory cell according to the first embodiment.

Referring to FIG. 14, in the fuse read mode, row decoder 20# selectively activates word line FWL in response to column address CA. Correspondingly, access transistor FTR having its gate electrically coupled to activated word line FWL turns on. Each source line driver SDR electrically couples source line FSL with ground voltage GND in response to control signal CSW (of an "L" level) in the initial state.

Next, in the fuse read mode, amplifier RAP provided for respective column is activated in response to the operation designation of the fuse read mode from sub-control circuit 5#, and pulls up the corresponding bit line to a prescribed voltage.

Correspondingly, a current path is formed from amplifier RAP, bit line BL, tunneling magneto-resistance element TMR, connect portion CH, access transistor FTR, to source line FSL (GND). That is, the data read current corresponding to the load resistance (electric resistance) of connect portion CH is supplied from amplifier RAP to the selected memory cell via the current path. Specifically, when connect portion CH is in the programmed state, the data read current supplied from amplifier RAP is small, since the load resistance of connect portion CH is set to a resistance value R1 (of some hundreds of M$\Omega$). By comparison, when connect portion CH is in the non-programmed state, the load resistance of connect portion CH is set to a resistance value Rs (of some $\Omega$), so that the data read current supplied from amplifier RAP becomes great. Thus, amplifier RAP can output program data stored in connect portion CH as read data RDT, based on comparison of the data read current with a reference current Iref that would be generated by a resistance value of an intermediate level between resistance values R1 and Rs with respect to a prescribed voltage.

Specifically, amplifier RAP corresponding to bit line BL0 outputs read data RDT corresponding to program data "0", and amplifier RAP corresponding to bit line BLn outputs read data RDT corresponding to program data "1".

In this fuse read mode, a current taking account of the electric resistance of tunneling magneto-resistance element TMR is supplied as the load resistance of the current path defining the data read current. However, the electric resistance (Rmin, Rmax) of tunneling magneto-resistance element TMR is restricted to some tens of K$\Omega$, so that it hardly affects the comparison with the electric resistance of some hundreds of M$\Omega$ in the programmed state of connect portion CH.

Further, data read (hereinafter, referred to as the "AND read mode") with which a situation where connect portion CH is in the non-disconnected state and the electric resistance of tunneling magneto-resistance element TMR is Rmin is detected with one time data read operation, can be performed in the same manner as the fuse read mode.

Specifically, reference current Iref being input to amplifier RAP is set such that it corresponds to the resistance value of the intermediate level between Rmax and Rmin of tunneling magneto-resistance element TMR with respect to a prescribed voltage.

Correspondingly, when connect portion CH is in the disconnected state (programmed state), the load resistance on the current path becomes great, because of the electric resistance (of some hundreds of M$\Omega$) of connect portion CH, so that the resistance value (Rmin, Rmax) of tunneling magneto-resistance element TMR becomes negligible. On the other hand, assume that connect portion CH is in a non-disconnected state (non-programmed state) of resistance value Rs, and that tunneling magneto-resistance element TMR has resistance value Rmin. In this case, resistance value Rs is extremely small compared to resistance value Rmin, and thus, the resistance value on the current path depends on resistance value Rmin, making resistance value Rs negligible. Accordingly, it is possible to detect the situation where tunneling magneto-resistance element TMR has resistance value Rmin and connect portion CH has electric resistance value Rs, based on the comparison with reference current Iref. That is, one data read operation can detect read data RDT obtained by the AND operation of stored data in connect portion CH and in tunneling magneto-resistance element TMR. As such, the AND read mode can be performed on memory cell PMC.

Now, the case of writing program data to tunneling magneto-resistance element TMR by destroying or breaking a tunneling film of tunneling magneto-resistance element TMR (to attain a programmed state), is described. Hereinafter, the data write by breaking of the tunneling film of tunneling magneto-resistance element TMR is referred to as the MTJ blow mode.

It is assumed that program information is written in a unit of memory cell row, in the MTJ blow mode for memory cells PMC according to the first embodiment. In this example, the case of making memory cell PMC corresponding to bit line BL0 non-destructive (non-programmed state) and making memory cell PMC corresponding to bit line BLn destructive (programmed state), is described.

Figure 15:
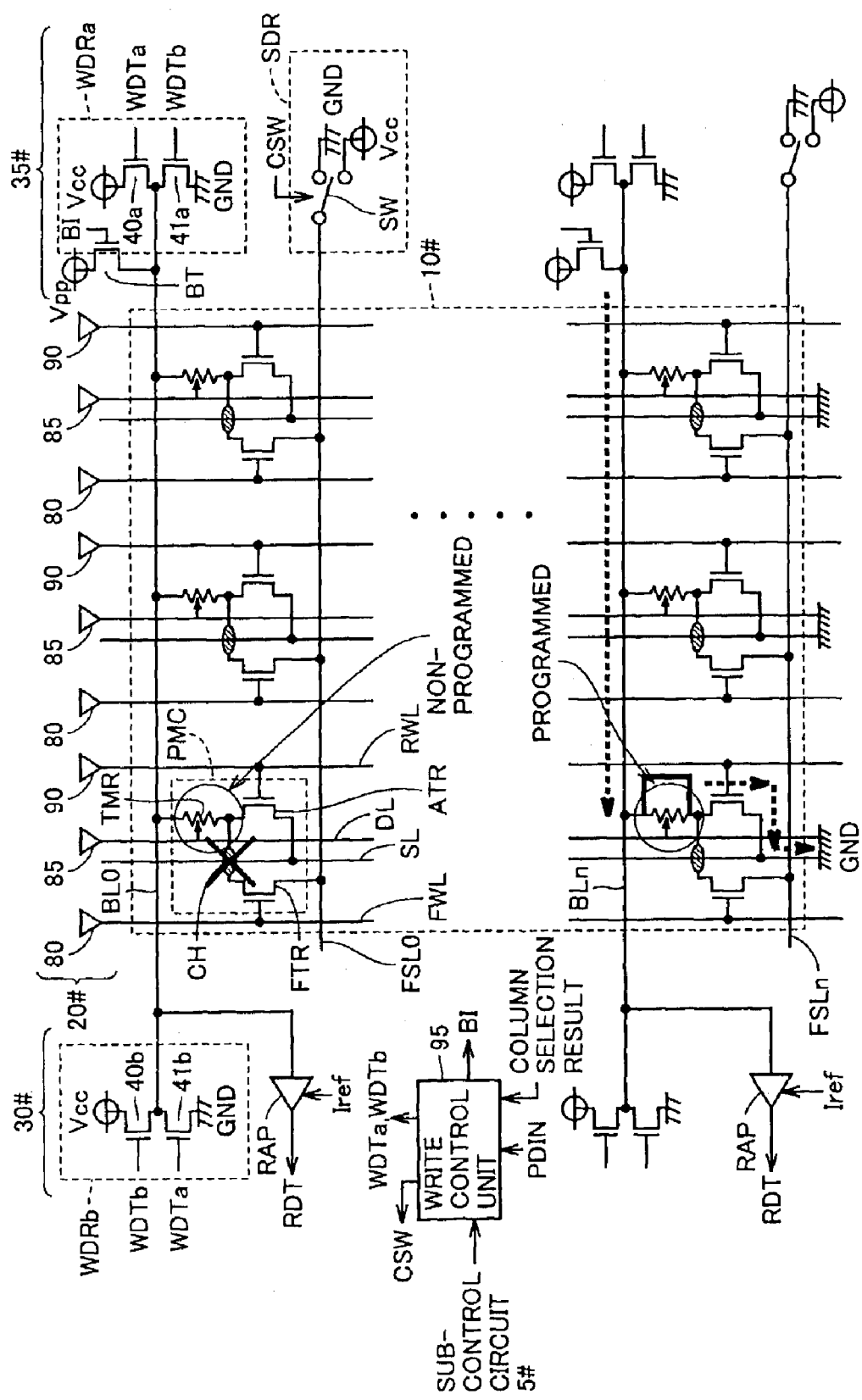
FIG. 15 is a conceptual diagram illustrating the case of performing an MTJ blow mode on the memory cell according to the first embodiment.

Referring to FIG. 15, in the MTJ blow mode, write control unit 95 outputs control signal BI to transistor BT provided for respective memory cell column, in response to program data PDIN, the column selection result of column decoder 25# and the operation designation of the MTJ blow mode from sub-control circuit 5#. It is assumed that control signal BI thus set in respective transistor BT is latched by a latch circuit (not shown).

It is assumed by way of example that write control unit 95 outputs control signal BI of an "L" level to transistor BT corresponding to bit line BL0, and outputs control signal BI of an "H" level to transistor BT corresponding to bit line BLn. In response thereto, bit line BL0 attains an open state, and bit line BLn is charged to boosted voltage Vpp.

Approximately at the same timing, row decoder 20 selectively activates (to an "H" level) word line RWL corresponding to the memory cell row in accordance with the input of row address RA. Correspondingly, access transistor ATR corresponding to the activated word line RWL turns on.

Thus, a current path is formed through bit line BLn, from transistor BT (boosted voltage Vpp), bit line BLn, access transistor ATR, source line SL, to ground voltage GND.

With the current being passed through tunneling magneto-resistance element TMR, an applied voltage is generated in tunneling magneto-resistance element TMR corresponding to the electric resistance. In the MTJ read mode and others described above, it would be necessary to set the prescribed pull-up voltage at a level not breaking the tunneling film of tunneling magneto-resistance element TMR. By comparison, in the present example, boosted voltage Vpp having a voltage level sufficiently higher than the prescribed voltage, is used to apply a voltage (of, e.g., about 1V) that can break the tunneling film.

The tunneling film is thus broken, and the electric resistance value of the tunneling magneto-resistance element is fixedly set to the electric resistance value Rmin# that is extremely lower than the electric resistance value Rmin. Data storage of one bit can be performed by correlating the electric resistance value Rmin# with the tunneling film broken and the electric resistance value (Rmax, Rmin) before breakage thereof to program data "0" and "1", respectively.

In the present example, with the MTJ blow mode, program data "0" can be written into selected memory cell PMC corresponding to bit line BLn, by breaking the tunneling film of the tunneling magneto-resistance element to fixedly set the electric resistance value to Rmin#.

The configuration of performing the MTJ blow mode using boosted voltage Vpp has been described in the present example. However, not limited thereto, another power supply voltage may be employed therefor. Specifically, by way of example, either one of bit line drivers WDRa and WDRb may be employed to supply power supply voltage Vcc to bit line BL in response to a control signal. Such a configuration eliminates the necessity of providing transistor BT, so that the number of parts in the circuit can be reduced. The time required to break a tunneling film depends on a voltage applied. Thus, a high voltage must be applied for rapid breakage thereof.

Various kinds of data write including the MTJ write mode described above are configured to perform parallel data write for each memory cell row, thereby enabling rapid data writing of program information.

Further, various kinds of data read including the MTJ read mode described above are configured to perform parallel data read for each memory cell row, and thus, rapid data reading of program information becomes possible.

In the description above, the configurations of performing data write and data read in units of memory cell rows have been described. Alternatively, they may be configured to perform various kinds of data write and data read for a single memory cell.

As described above, memory cell PMC constituting memory array 10# of program circuit 40 can store a plurality of pieces of program data by various kinds of data write. Specifically, program data of 2 bits can be stored in one memory cell PMC using the MTJ write mode and the fuse blow mode, or using the fuse blow mode and the MTJ blow mode.

Thus, the program elements according to the present embodiment can be used to readily support the situation where program information of defective addresses and others are stored in memory cells PMC before shipment and further program information of defective addresses and others should be additionally stored after shipment.

Further, such memory cells PMC storing program data in the tunneling magnetic storage portion and in the connect portion as described above can constitute efficient program elements, from the standpoints of a degree of integration and simplicity in designing.

Still further, storing the same program data in the tunneling magnetic storage portion and in the connect portion with its state fixedly changed, allows for recovery of the program data in the tunneling magnetic storage portion in case the same is lost due to magnetic noise or the like.

In the above description, one connect portion CH and one access transistor FTR for selectively generating a current path have been provided for memory cell PMC. Alternatively, a plurality of connect portions CH and a plurality of access transistors FTR corresponding thereto may be provided to store program data of more than one bit in one memory cell PMC.

Second Embodiment

In the first embodiment above, the configuration of program circuit 40 having integrally arranged memory cells PMC capable of efficiently storing program data has been described.

In the second embodiment of the present invention, a program circuit configured with a program element automatically decoding program data upon power-up is described.

Figure 16:
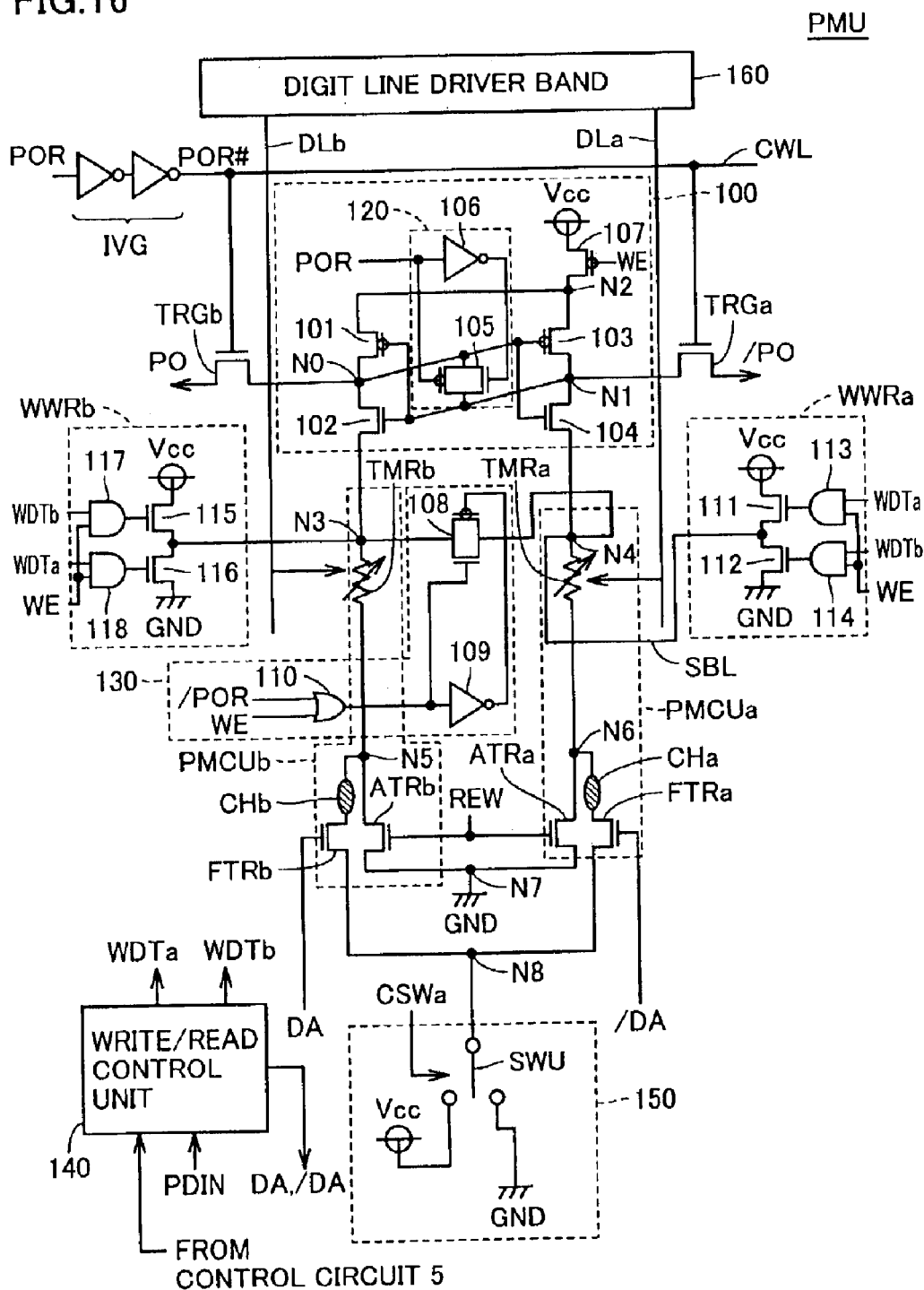
FIG. 16 is a circuit configuration diagram of a program unit constituting a program element according to a second embodiment of the present invention.

Referring to FIG. 16, a program unit PMU constituting the program element according to the second embodiment includes: a bit line SBL for supplying a data write current; bit line drivers WWRb, WWRa provided corresponding to one end and the other end of bit line SBL; a program cell unit PMCUb provided on the one end of bit line SBL and electrically coupled to bit line SBL and storing program data; a program cell unit PMCUa provided on the other end of bit line SBL and storing program data; and a write/read control unit 140 generating write control signals WDTa, WDTb and control signals DA, /DA in response to program data PDIN externally supplied and an operation designation from control circuit 5. Here, bit line SBL is arranged to provide program cell units PMCUa and PMCUb with data write currents of different directions from each other. This program unit PMU constitutes the program circuit according to the second embodiment.

Program unit PMU further includes: a source voltage driver 150 which supplies one of power supply voltage Vcc and ground voltage GND to a source voltage supply node N8; digit lines DLa and DLb provided corresponding to program cell units PMCUa and PMCUb, respectively, and supplied with data write currents at the time of data write; a digit line driver band 160 which supplies the data write currents to digit lines DLa and DLb at the time of data write; and an equalize circuit 130 which electrically couples a connect node N4 of program cell unit PMCUa connected to bit line SBL and a connect node N3 of program cell unit PMCUb, for equalization.

Program unit PMU further includes: a latch circuit 100 electrically coupled to bit line SBL and latching and outputting program data held in program cell units PMCUa and PMCUb; gate transistors TRGb, TRGa transmitting data signals PO, /PO output from respective output nodes N0 and N1 of latch circuit 100; a select line CWL electrically coupled to gates of gate transistors TRGa and TRGb; and a driver IVG transmitting a control signal POR# to select line CWL in response to an input of a control signal POR.

Here, control signal POR is used as a reset signal of an internal circuit of the device, and is generated by control circuit 5. Specifically, control signal POR is set to an "L" level upon power-up and held at the "L" level until a power supply voltage exceeds a prescribed threshold voltage, and is set to an "H" level when it exceeds the prescribed threshold voltage. Control circuit 5 has a power-on reset circuit (not shown), from which control signal POR is output. Driver IVG is formed with an even number of inverters (two in this example) and, in receipt of control signal POR, delays control signal POR for a prescribed period and outputs the delayed signal as control signal POR#.

Bit line driver WWRa includes transistors 111, 112 and AND circuits 113, 114. Transistor 111 is arranged between power supply voltage Vcc and the other end of bit line SBL, and has its gate electrically coupled to an output node of AND circuit 113. Transistor 112 is arranged between ground voltage GND and the other end of bit line SBL, and has its gate electrically coupled to an output node of AND circuit 114. AND circuit 113 receives write control signal WDTa and control signal WE, and outputs the AND operation result to the gate of transistor 111. AND circuit 114 receives write control signal WDTb and control signal WE, and outputs the AND operation result to the gate of transistor 112. Control signal WE is output from control circuit 5.

Bit line driver WWRb includes transistors 115, 116 and AND circuits 117, 118. Transistor 115 is arranged between power supply voltage Vcc and the one end of bit line SBL, and has its gate electrically coupled to an output node of AND circuit 117. Transistor 116 is arranged between ground voltage GND and the one end of bit line SBL, and has its gate electrically coupled to an output node of AND circuit 118. AND circuit 117 receives write control signal WDTb and control signal WE, and outputs the AND operation result to the gate of transistor 115. AND circuit 118 receives write control signal WDTa and control signal WE, and outputs the AND operation result to the gate of transistors 116.

For example, when write control signal WDTa is set to an "H" level and control signal WE is at an "H" level, bit line driver WWRa turns transistor 111 on, and electrically couples the other end side of bit line SBL with power supply voltage Vcc. Bit line driver WWRb turns transistor 116 on, and electrically couples the one end side of bit line SBL with ground voltage GND. Correspondingly, a current path is formed from the other end side to the one end side of bit line SBL, and the data write current flows therethrough. When write control signal WDTb is set to an "H" level, a current path is formed from the one end side to the other end side of bit line SBL, through which the data write current flows.

Program cell unit PMCUa includes a tunneling magneto-resistance element TMRa, a connect portion CHa, and access transistors ATRa, FTRa. Program cell unit PMCUa has the same configuration as that of memory cell PMC explained in the first embodiment. Tunneling magneto-resistance element TMRa is arranged between nodes N4 and N6. Access transistor ATRa is arranged between a node N6 and a node N7 electrically coupled to ground voltage GND, and has its gate receiving an input of a control signal REW. Connect portion CHa and access transistor FTRa are connected in series between node N6 and node N8 receiving a supply of source voltage. Access transistor FTRa has its gate receiving an input of control signal /DA.

Program cell unit PMCUb includes a tunneling magneto-resistance element TMRb, a connect portion CHb, and access transistors ATRb, FTRb, and has the same configuration as memory cell PMC in the first embodiment. Tunneling magneto-resistance element TMRb is arranged between nodes N3 and N5. Access transistor ATRb is arranged between node N5 and node N7 electrically coupled to ground voltage GND, and has its gate receiving an input of control signal REW from control circuit 5. Connect portion CHb and access transistor FTRb are connected in series between node N5 and node N8 receiving the source voltage. Access transistor FTRb has its gate receiving an input of control signal DA.

Latch circuit 100 includes an equalize circuit 120 for equalization of output nodes N0 and N1, and transistors 101–104 and 107.

Transistor 107 is arranged between power supply voltage Vcc and node N2, and has its gate receiving an input of control signal WE. Transistor 101 is arranged between nodes N2 and N0, and has its gate electrically coupled to node N1. Transistor 102 is arranged between nodes N0 and N3, and has its gate electrically coupled to node N1. Transistor 103 is arranged between nodes N2 and N1, and has its gate electrically coupled to node N0. Transistor 104 is arranged between nodes N1 and N4, and has its gate electrically coupled to node N0. Here, by way of example, transistors 101, 103, 107 are P channel MOS transistors, and transistors 102, 104 are N channel MOS transistors.

Equalize circuit 120 includes an inverter 106 and a transfer gate 105, and receives an input of control signal POR and electrically couples nodes N0 and N1.

Program unit PMU further includes an equalize circuit 130 for equalization of nodes N3 and N4. Equalize circuit 130 includes an OR circuit 110, a transfer gate 108 and an inverter 109. Transfer gate 108 is arranged between nodes N3 and N4. It receives an output signal of OR circuit 110 and also receives the output signal of OR circuit 110 via inverter 109, and electrically couples nodes N3 and N4. OR circuit 110 receives control signal POR and control signal WE, and outputs the OR operation result to transfer gate 108 and to inverter 109.

Hereinafter, data write and data read of program data in program unit PMU according to the second embodiment will be described in detail.

Firstly, the MTJ write mode described above is explained. In this example, the case of writing program data "0" is described.

Figure 17:
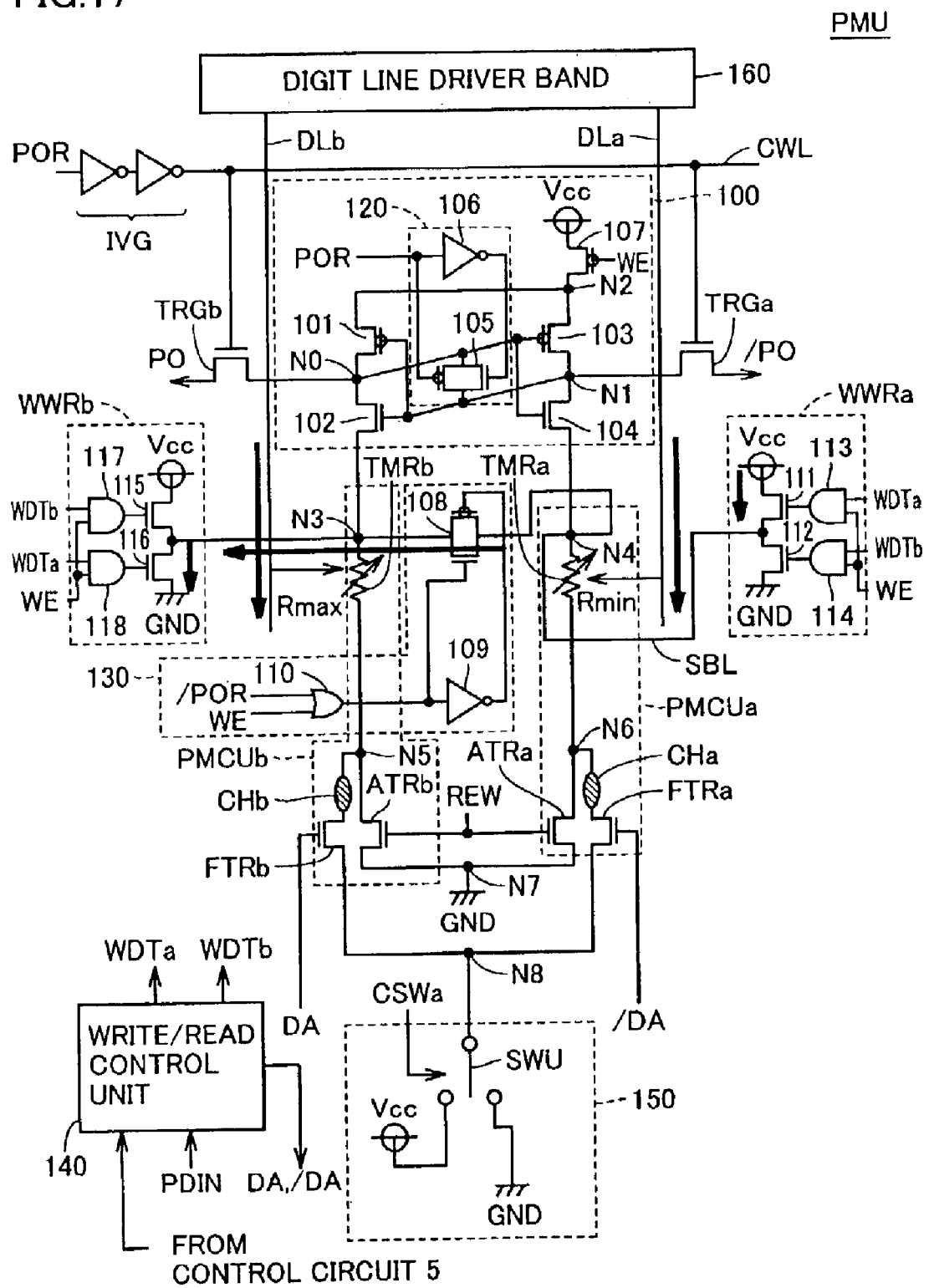
FIG. 17 is a conceptual diagram illustrating the case of performing data write of program data using tunneling magneto-resistance elements.

Referring to FIG. 17, write/read control unit 140 generates write control signals WDTa and WDTb in response to inputs of program data PDIN and an operation designation of the MTJ write mode from control circuit 5. Here, it is assumed that write control signals WDTa and WDTb are set to an "H" level and an "L" level, respectively.

Correspondingly, transistor 111 in bit line driver WWRa turns on, and power supply voltage Vcc and the other end side of bit line SBL are electrically coupled. Transistor 116 in bit line driver WWRb also turns on, and ground voltage GND and the one end side of bit line SBL are electrically coupled. Equalize circuit 130 electrically couples nodes N3 and N4 in response to control signal WE being set to an "H" level by control circuit 5 in the MTJ write mode. Thus, the data write current is supplied from the other end to the one end of bit line SBL.

Approximately at the same timing, digit line driver band 160 is activated, and correspondingly, the data write currents are supplied to digit lines DLa and DLb. The data write currents thus supplied to bit line SBL and to digit lines DLa, DLb cause prescribed magnetic fields to be applied to tunneling magneto-resistance elements TMRa and TMRb, so that data write is carried out in accordance with their magnetization directions. In this example, the data write currents of bit line SBL passed through tunneling magneto-resistance elements TMRa and TMRb are in opposite directions from each other. Thus, the electric resistance of tunneling magneto-resistance element TMRa becomes Rmin, and that of tunneling magneto-resistance element TMRb is set to Rmax. Accordingly, program data "0" is programmed using the tunneling magneto-resistance elements of program unit PMU.

Now, data write of program data "1" using tunneling magneto-resistance elements TMRa and TMRb, i.e., the MTJ write mode, is explained.

Figure 18:
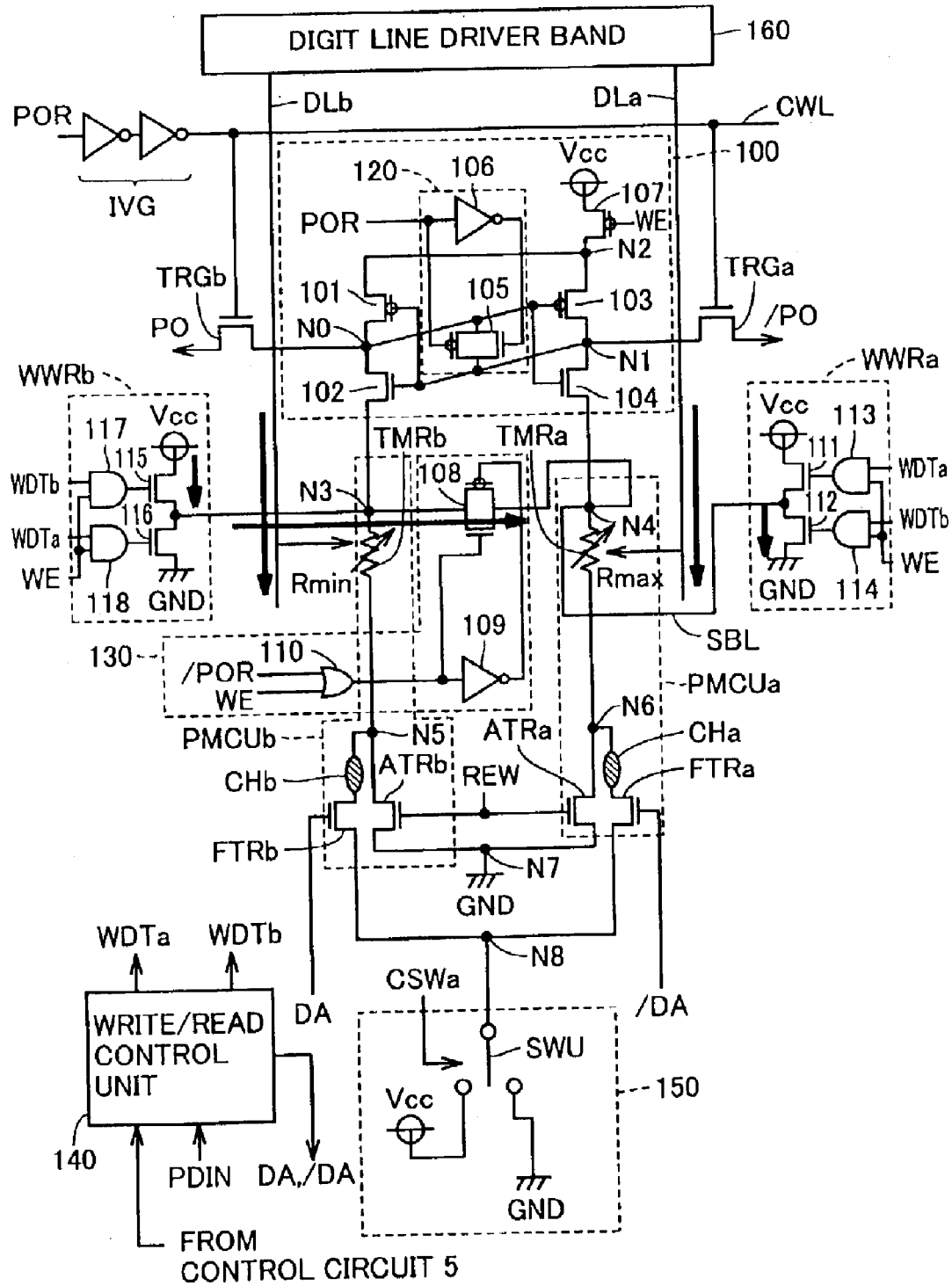
FIG. 18 is a conceptual diagram illustrating the case of performing the MTJ write mode using the tunneling magneto-resistance elements.

Referring to FIG. 18, write/read control unit 140 sets write control signals WDTa and WDTb to an "L" level and an "H" level, respectively, in the same manner as described above. Correspondingly, a data write current is supplied from the one end side to the other end side of bit line SBL. The program data "1" can be written to tunneling magneto-resistance elements TMRa and TMRb of program unit PMU in accordance with the data write current passed through bit line SBL. In this example, tunneling magneto-resistance element TMRa has electric resistance value Rmax and tunneling magneto-resistance element TMRb has electric resistance value Rmin.

Now, the MTJ read mode in the case of automatically reading program data stored in the tunneling magneto-resistance elements of program unit PMU upon power-up is explained.

Figure 19:
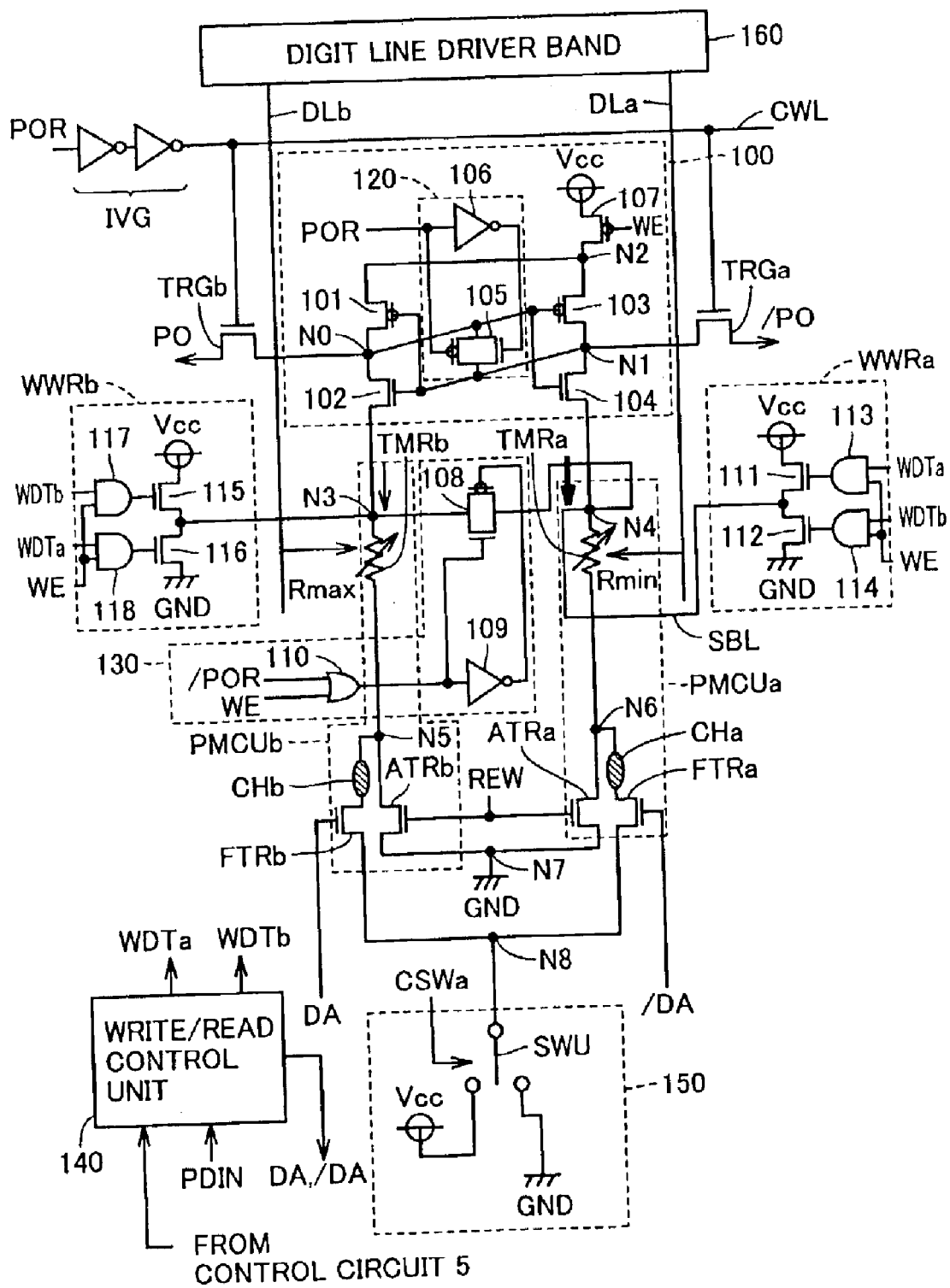
FIG. 19 is a conceptual diagram illustrating the MTJ read mode according to the second embodiment.

Referring to FIG. 19, the MTJ read mode according to the second embodiment is described. In this example, data read in the case where program data "0" is prestored in program unit PMU using the tunneling magneto-resistance elements is explained.

The operation in the MTJ read mode is described with reference to the timing chart in FIG. 20.

Figure 20:
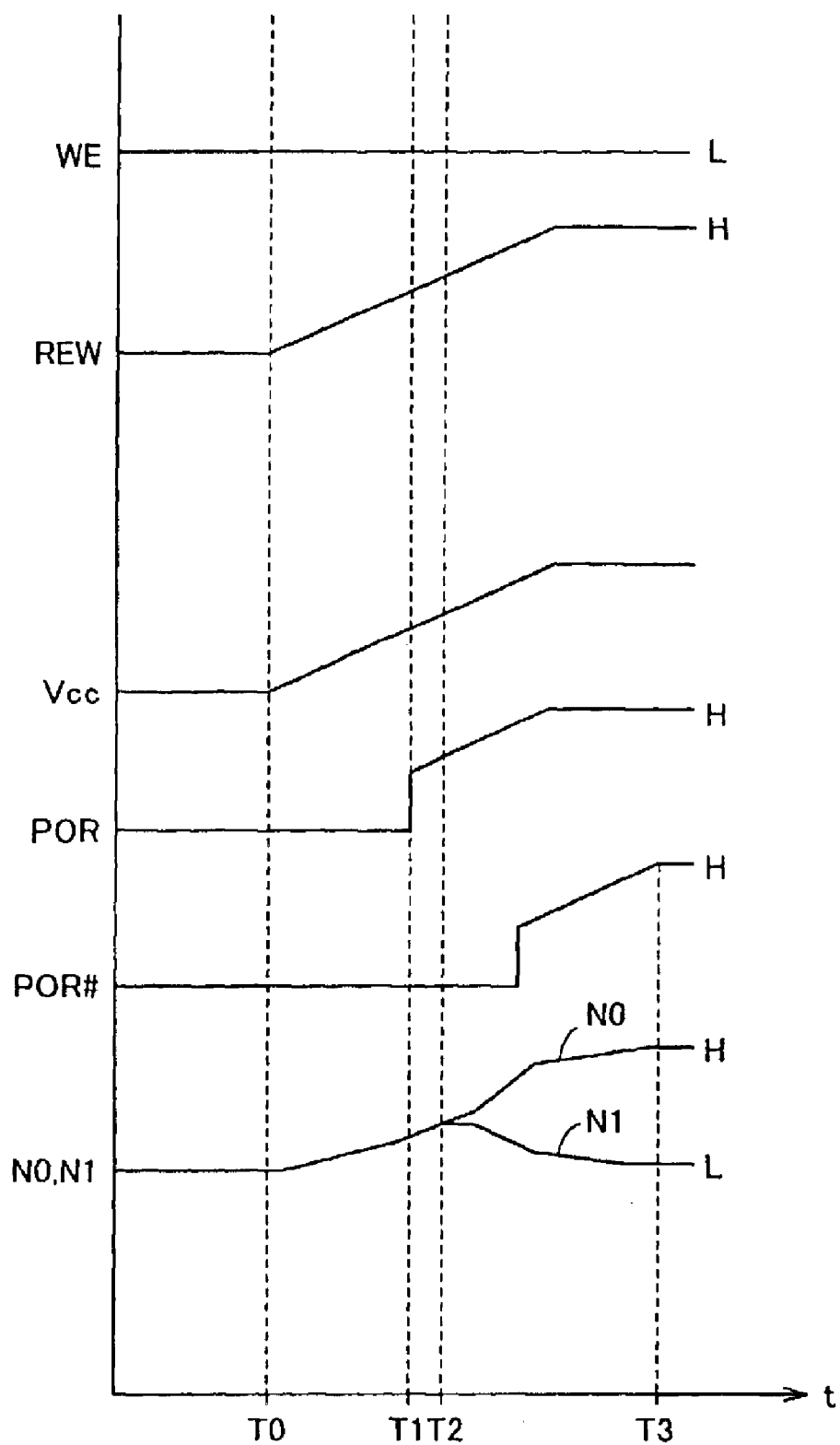
FIG. 20 is a timing chart illustrating an operation in the MTJ read mode.

Referring to FIGS. 19 and 20, power supply voltage Vcc is turned on at time T0. At this time, power supply voltage Vcc is less than a prescribed threshold voltage level, and control signal POR is set at an "L" level. Thus, equalize circuit 120 electrically connects nodes N0 and N1 in responds to control signal POR (of the "L" level), to equalize the output nodes of latch circuit 100. Equalize circuit 130 electrically connects nodes N3 and N4, in response to control signal POR (of the "L" level), for equalization. Latch circuit 100 is activated in response to control signal WE (of an "L" level), and power supply voltage Vcc is supplied to node N2, so that charging of nodes N0 and N1 starts.

At time T1 after the power-up, power supply voltage Vcc reaches the prescribed threshold voltage level, and control signal POR makes a transition from the "L" level to an "H" level. In response, equalize circuits 120 and 130 terminate equalization. Approximately at the same timing, control circuit 5 activates control signal REW (to an "H" level).

Correspondingly, access transistors ATRa and ATRb turn on, and tunneling magneto-resistance elements TMRa and TMRb are both electrically coupled to ground voltage GND. That is, tunneling magneto-resistance elements TMRa and TMRb are supplied with currents from latch circuit 100 in accordance with their respective electric resistances.

At time T2, a potential difference occurs between nodes N0 and N1 in accordance with the difference of the currents passed through tunneling magneto-resistance elements TMRa and TMRb. This potential difference is further amplified by latch circuit 100, and the voltage levels of output nodes N0 and N1 are set to an "H" level and an "L" level, respectively.

Next, at time T3 when the voltage levels of output nodes N0 and N1 become sufficiently stable, gate transistors TRGa and TRGb turn on based on control signal POR#. Correspondingly, program unit PMU outputs data signal PO (or/ PO) corresponding to program data ("0"). Thus, program data "0" stored in the tunneling magneto-resistance elements of program unit PMU is automatically read out at the time of power-up.

As such, latch circuit 100 amplifies and outputs the stored data in the program cell unit, whereby stable data read is accomplished.

Now, the MTJ read mode in the case where program data "1" is stored in program unit PMU is described.

Figure 21:
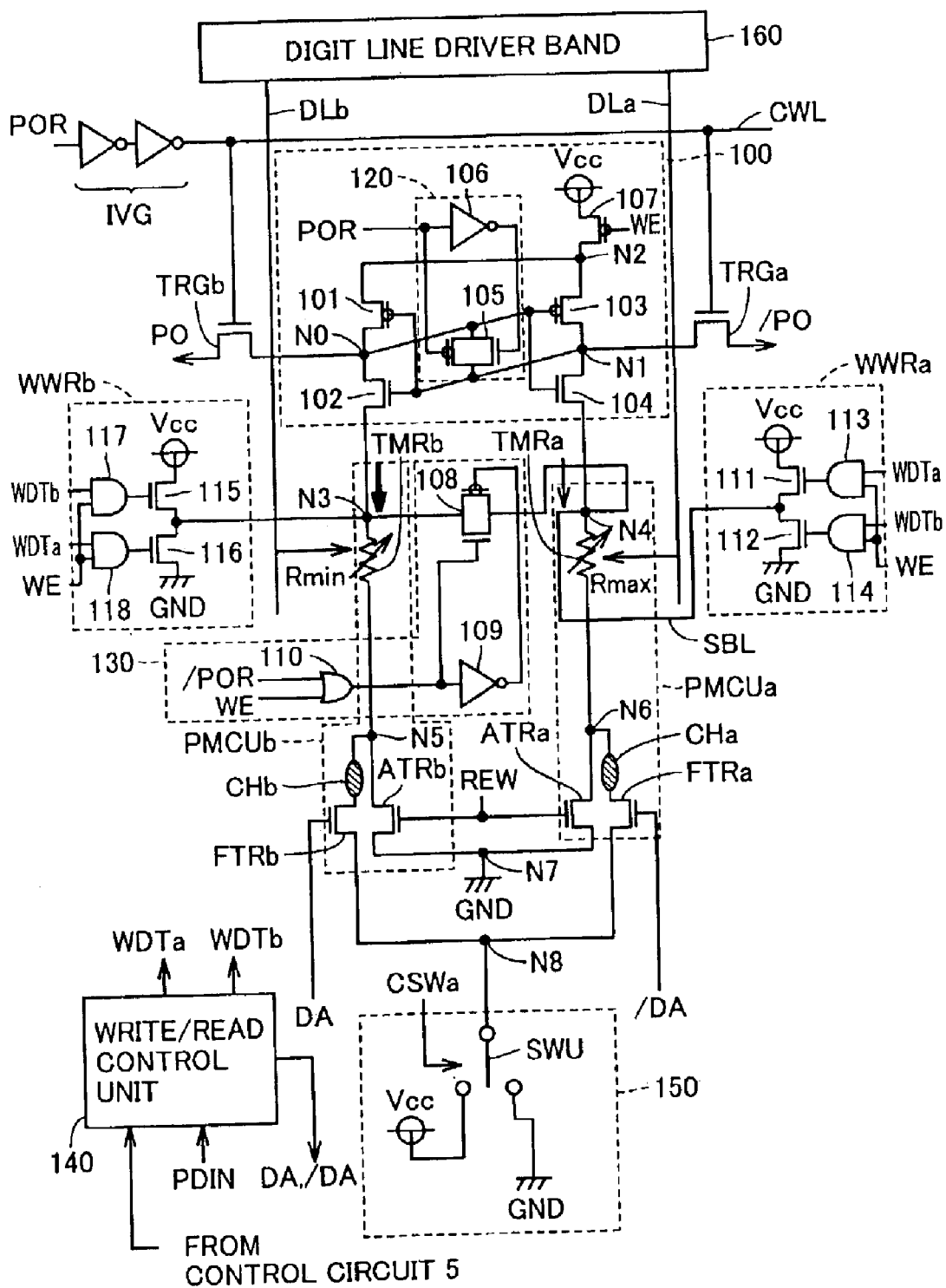
FIG. 21 is a conceptual diagram illustrating the MTJ read mode in the case where program "1" is stored in a program unit.

Referring to FIG. 21, in the MTJ read mode according to the second embodiment, a potential difference in accordance with the electric resistances of tunneling magneto-resistance elements TMRa and TMRb is generated between nodes N0 and N1, in the same manner as shown in FIG. 20. That is, in the present example, nodes N0 and N1 are set to an "L" level and an "H" level, respectively, and data signals PO, /PO are output as an "L" level and an "H" level, respectively. Specifically, program unit PMU outputs data signal PO (or /PO) corresponding to program data ("1"). Otherwise, the same read operation as explained in conjunction with FIG. 20 is carried out, and thus, detailed description thereof is not repeated.

Now, the fuse blow mode, as described above, for storing program data in connect portions CHa, CHb of program unit PMU is described.

Figure 22:
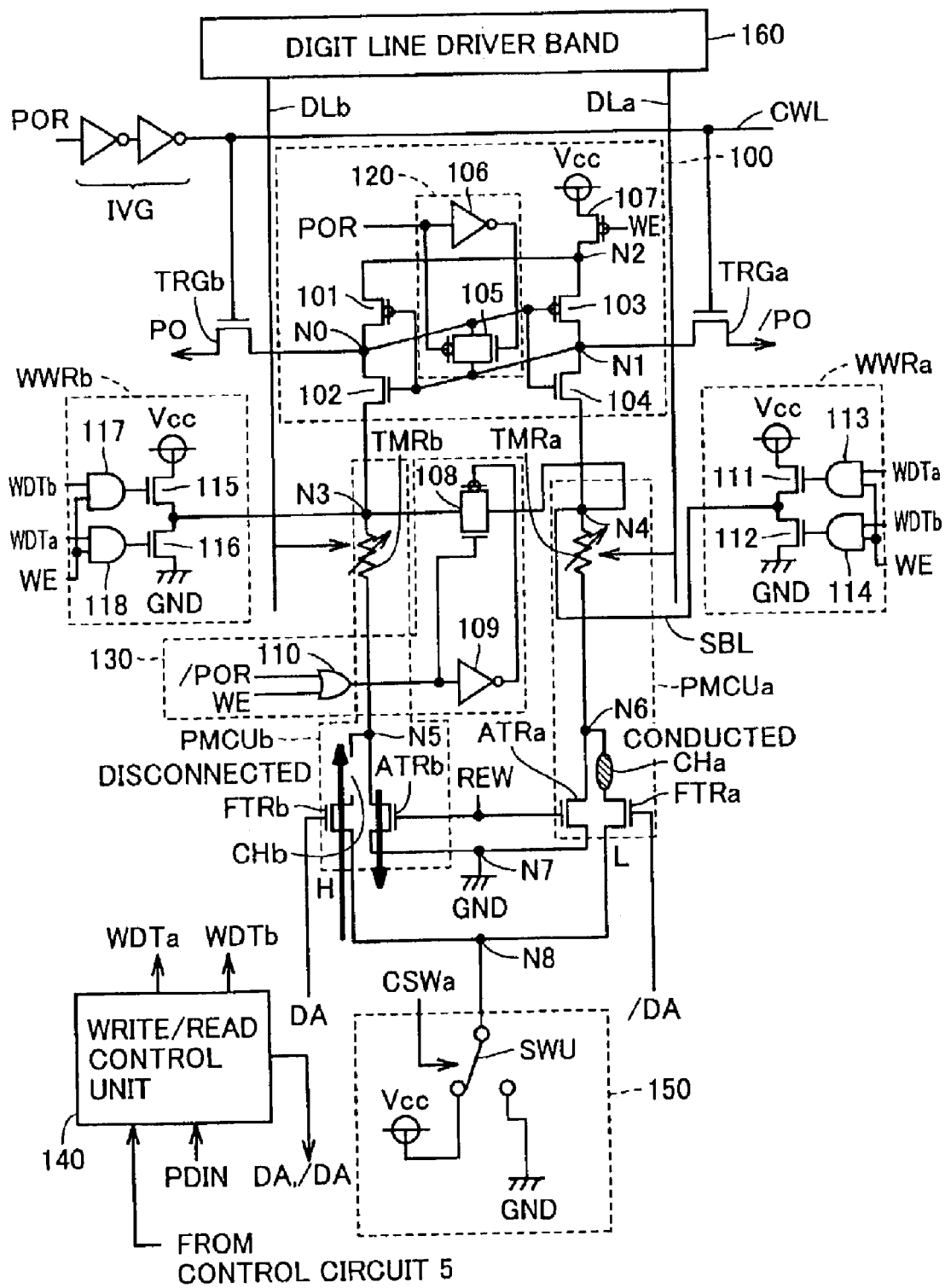
FIG. 22 is a conceptual diagram illustrating the fuse blow mode according to the second embodiment.

Referring to FIG. 22, the fuse blow mode according to the second embodiment is explained. Here, the case of storing program data "0" using connect portions CHa and CHb is described.

Firstly, source voltage driver 150 receives control signal CSWa (of an "H" level) activated in the fuse blow mode by control circuit 5, and electrically couples node N8 to power supply voltage Vcc.

Next, write/read control unit 140 responds to an operation designation of the fuse blow mode from control circuit 5, and generates control signals DA, /DA in accordance with program data PDIN. In this example, write/read control unit 140 sets control signals DA, /DA to an "H" level and an "L" level, respectively, corresponding to program data "0". In the fuse blow mode, approximately at the same timing, control circuit 5 sets control signal REW to an "H" level.

Correspondingly, access transistor FTRb turns on, and a current path from source voltage driver 150 via connect portion CHb to ground voltage GND is formed. A current path via connect portion CHa is not formed, since access transistor FTRa is off.

Thus, connect portion CHb attains a hardly connected or substantially disconnected state based on the current passing therethrough. That is, the electric resistance of connect portion CHb is set to a high resistance state, as described above.

Accordingly, program data can be written by electrically disconnecting one of connect portions CHa and CHb in accordance with the program data.

Figure 23:
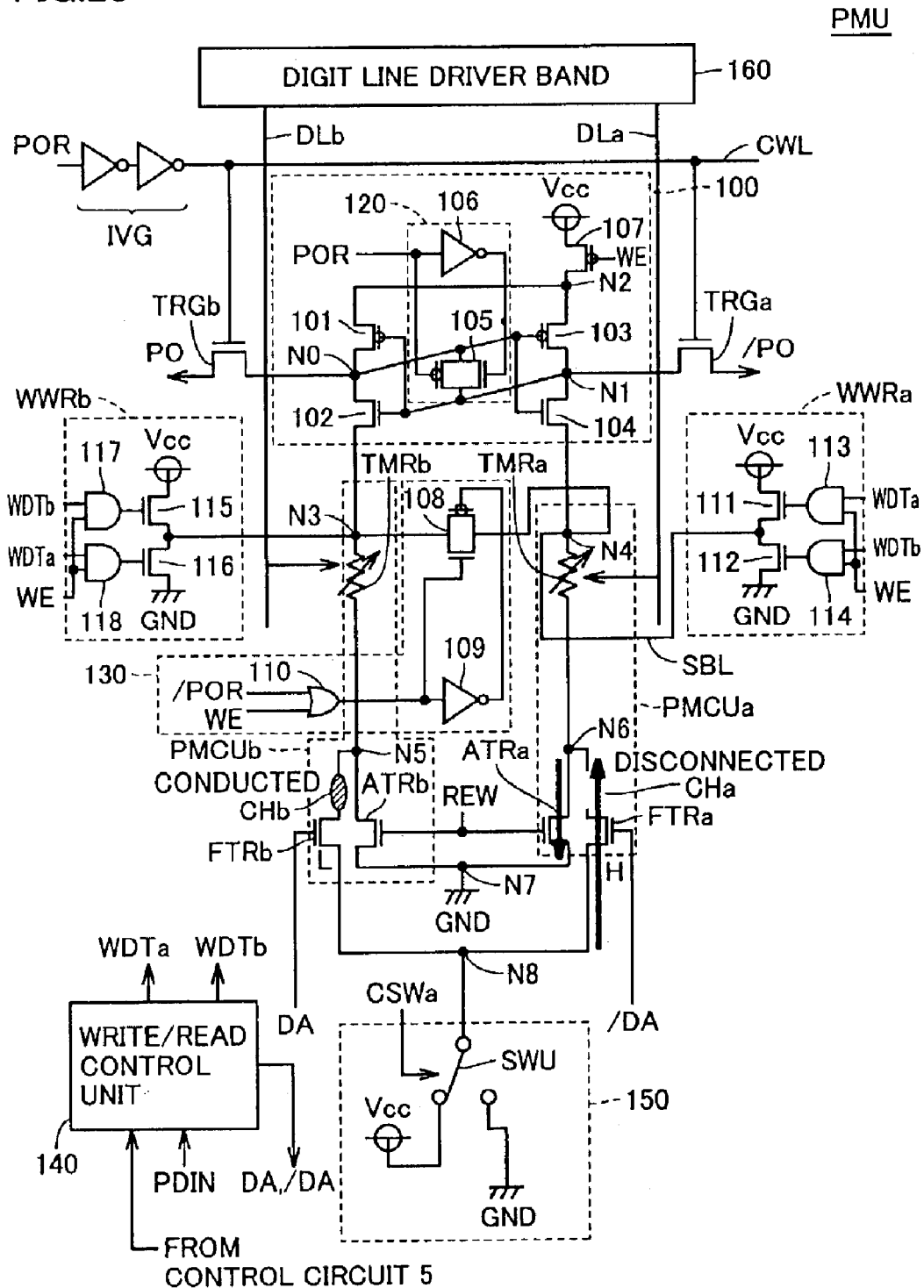
FIG. 23 is a conceptual diagram illustrating the fuse blow mode in the case where program data "1" is written using connect portions.

Now, the fuse blow mode in the case of writing program data "1" using connect portions CHa, CHb is explained with reference to FIG. 23.

Here, power supply voltage Vcc is supplied to node N8 in response to control signal CSWa, and control signal REW is set to an "H" level, in the same manner as explained in conjunction with FIG. 22. In this example, write/read control unit 140 sets control signals DA, /DA to an "L" level and an "H" level, respectively. In response, access transistor FTRa turns on, and a current path via access transistors FTRa and ATRa through connect portion CHa is formed. Connect portion CHa is disconnected with this current passing therethrough, and the load resistance of connect portion CHa is set to a high resistance state. Program data "1" can be written accordingly.

Now, the fuse read mode for automatically reading program data stored in connect portions CHa and CHb of program unit PMU upon powerup is described.

Figure 24:
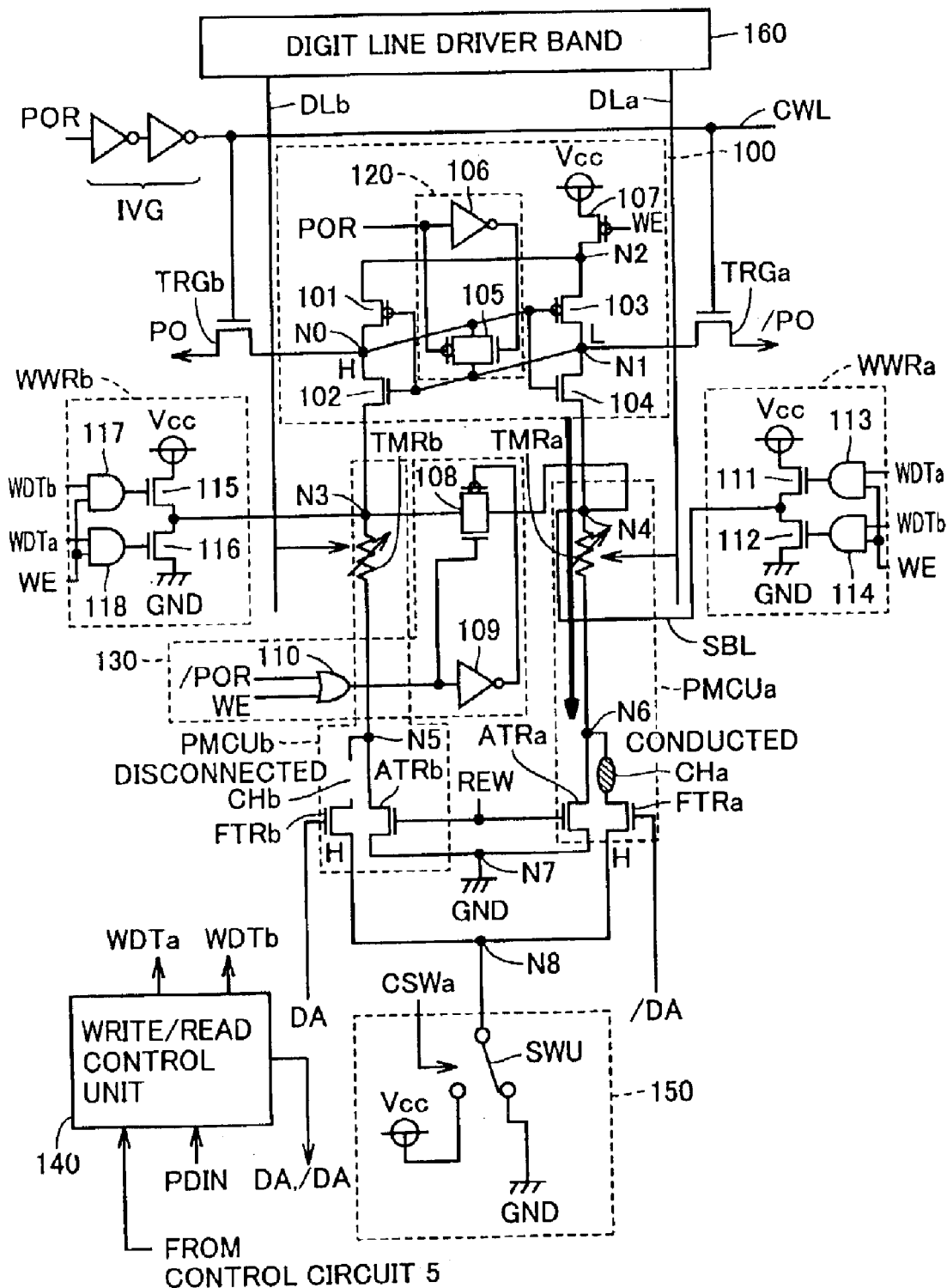
FIG. 24 is a conceptual diagram illustrating the fuse read mode according to the second embodiment.

Referring to FIG. 24, the fuse read mode according to the second embodiment is described. Here, data read in the case where program data "0" is prestored in program unit PMU using connect portions CHa and CHb is explained.

The operation in the fuse read mode is explained with reference to the timing chart in FIG. 25.

Figure 25:
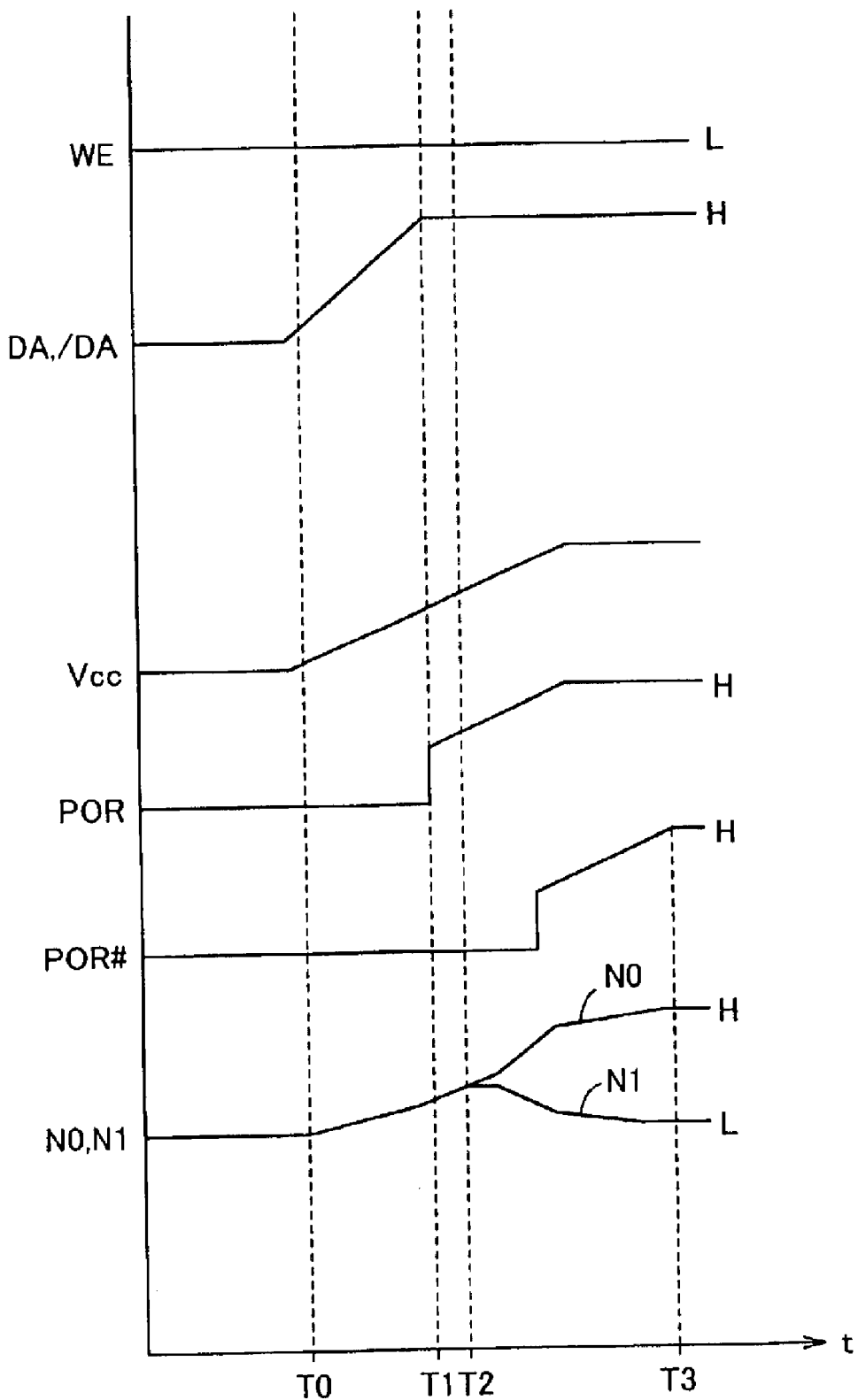
FIG. 25 is a timing chart illustrating an operation in the fuse read mode.

Referring to FIGS. 24 and 25, power supply voltage Vcc is turned on at time T0. At this time, power supply voltage Vcc is less than a prescribed threshold voltage level, and control signal POR is set at an "L" level. Thus, equalize circuit 120 responds to control signal POR (of the "L" level) and electrically connects nodes N0 and N1 to equalize the output nodes of latch circuit 100. Equalize circuit 130 responds to control signal POR (of the "L" level) to electrically connect nodes N3 and N4 for equalization. Latch circuit 100 is activated in response to control signal WE (of an "L" level), and power supply voltage Vcc is supplied to node N2, so that charging of nodes N0 and N1 starts. Control signal CSWa is at an "L" level of the initial state. In response to this control signal CSWa, ground voltage GND is supplied to source voltage supply node N8.

At time T1 after the power-up, power supply voltage Vcc reaches the prescribed threshold voltage level, and control signal POR goes from the "L" level to an "H" level. In response thereto, equalize circuits 120 and 130 terminate equalization. Approximately at the same timing, write/read control unit 140 sets control signals DA, /DA both to an "H" level.

Corresponding thereto, access transistors FTRa and FTRb turn on, and connect portions CHa and CHb are both electrically coupled to ground voltage GND. That is, latch circuit 100 supplies currents to connect portions CHa and CHb corresponding to their respective electric resistances.

At time T2, a potential difference occurs between nodes N0 and N1 in accordance with the difference of the currents passed through connect portions CHa and CHb. This potential difference is amplified by latch circuit 100, and the voltage levels of output nodes N0 and N1 are set to an "H" level and an "L" level, respectively.

Next, at time T3 when the voltage levels of nodes N0 and N1 become sufficiently stable, gate transistors TRGa and TRGb turn on based on control signal POR#. Correspondingly, program unit PMU outputs data signal PO (or/ PO) corresponding to program data ("0"). Thus, program data "0" stored in program unit PMU is read out. In this fuse read mode, the current difference, or, the potential difference depends on the electric resistance of connect portion CHb as described above. Thus, it is unnecessary to take account of the electric resistance values of the tunneling magneto-resistance elements.

Figure 26:
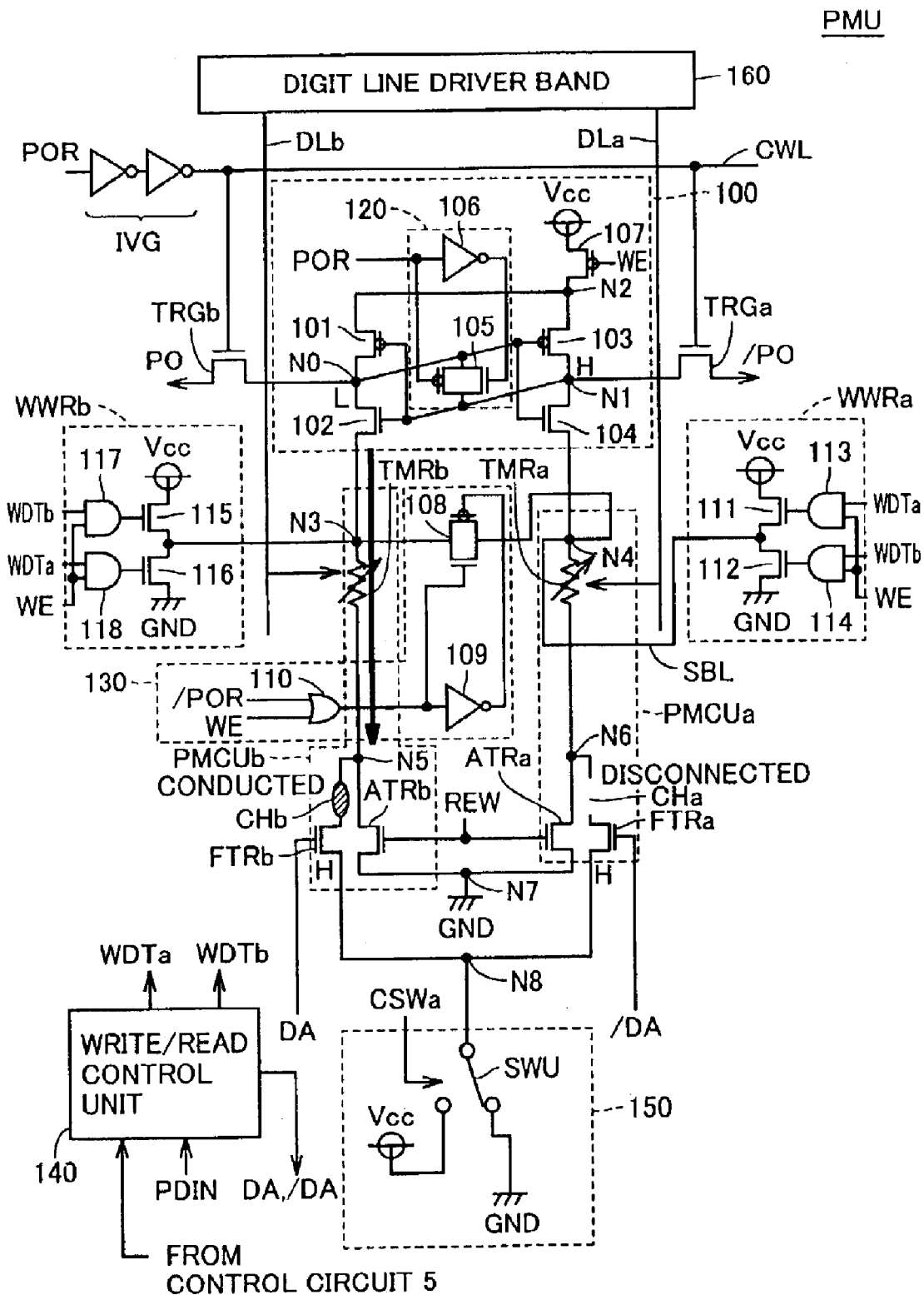
FIG. 26 is a conceptual diagram illustrating the fuse read mode for reading program data "1" stored in the connect portions.

Referring to FIG. 26, the fuse read mode in the case of reading program data "1" stored in connect portions CHa, CHb is described.

In the fuse read mode according to the second embodiment, a potential difference in accordance with the electric resistances of connect portions CHa, CHb is generated between nodes N0 and N1 in the same manner as shown in FIG. 25. That is, in this example, nodes N0 and N1 are set to an "L" level and an "H" level, respectively, and data signals PO, /PO are output as an "L" level and an "H" level, respectively. Specifically, program unit PMU outputs data signal PO (or/PO) corresponding to program data ("1"). Otherwise, the same read operation as explained in conjunction with FIG. 25 is carried out, and thus, detailed description thereof is not repeated.

Program unit PMU thus configured allows stored program data to be automatically decoded upon power-up. The time required for the data read operation of program data is reduced, and thus, the operations based on the program information can be performed at high speed.

Configuring program unit PMU with program cell units PMCUa, PMCUb enables storage of a plurality of bits of program data with various kinds of data write. For example, the MTJ write mode and the fuse blow mode can be used to store program data of two bits in one memory cell PMC.

Thus, the program elements according to the present embodiment can readily support the situation where program information including defective addresses and others has been stored in memory cells PMC before shipment and further program information of defective addresses and others should be stored after shipment. In addition, if the program data in tunneling magneto-resistance element TMRs or the like is destroyed, it can be recovered using connect portion CHa or the like.

Further, program unit PMU has program cell units PMCUa and PMCUb written with complementary program data, so that it can perform stable data read.

Still further, since the same program data as in the tunneling magneto-resistance element is written into the connect portion having its state fixedly changed, it is possible to recover program data in the tunneling magneto-resistance element if it is lost due to a magnetic noise or the like.

In the configuration described above, one access transistor FTRa (FTRb) is provided in program cell unit PMCUa (PMCUb) for selectively generating a current path with connect portion CHa (CHb). Alternatively, a plurality of connect portions CHa (CHb) and a plurality of access transistors FTRa (FTRb) corresponding thereto may be provided to allow storage of program data of more than one bit in one program unit PMU.

In the second embodiment, the program circuit configured with one program unit PMU has been described. However, the program circuit may be configured with a plurality of program units PMU. Further, in the second embodiment, latch circuit 100 has been configured such that it is electrically coupled directly to node N3 on the tunneling magneto-resistance element TMRb side and to node N4 on the tunneling magneto-resistance element TMRa side. Alternatively, latch circuit 100 can be configured to latch program data stored in program cell units PMCUa and PMCUb. Specifically, selectively activated transistors can be provided between transistor 102 of latch circuit 100 and node N3 and between transistor 104 of latch circuit 100 and node N4, and the transistors can be controlled to latch the program data in program cell units PMCUa and PMCUb.

Still further, in the present example, a plurality of program cell units, each of more than one bit, are arranged in one program unit PMU. This allows each program cell unit to store data independently from each other. The program data thus stored can be read out independently from each other, by selectively applying control signals (DA, /DA, REW) to the program cell units. As such, the program data can be utilized efficiently.

Third Embodiment

In the third embodiment of the present invention, application of program unit PMU in the second embodiment to a system employing a field programmable gate array (FPGA) is explained. The FPGA is a semiconductor device which has an internal circuit provided therein in advance and which can be changed to perform a prescribed operation by externally providing data and others to the internal circuit afterward. Generally, the program information for use in such a change of the operation is stored in a prescribed region within the internal circuit.

Figure 27:
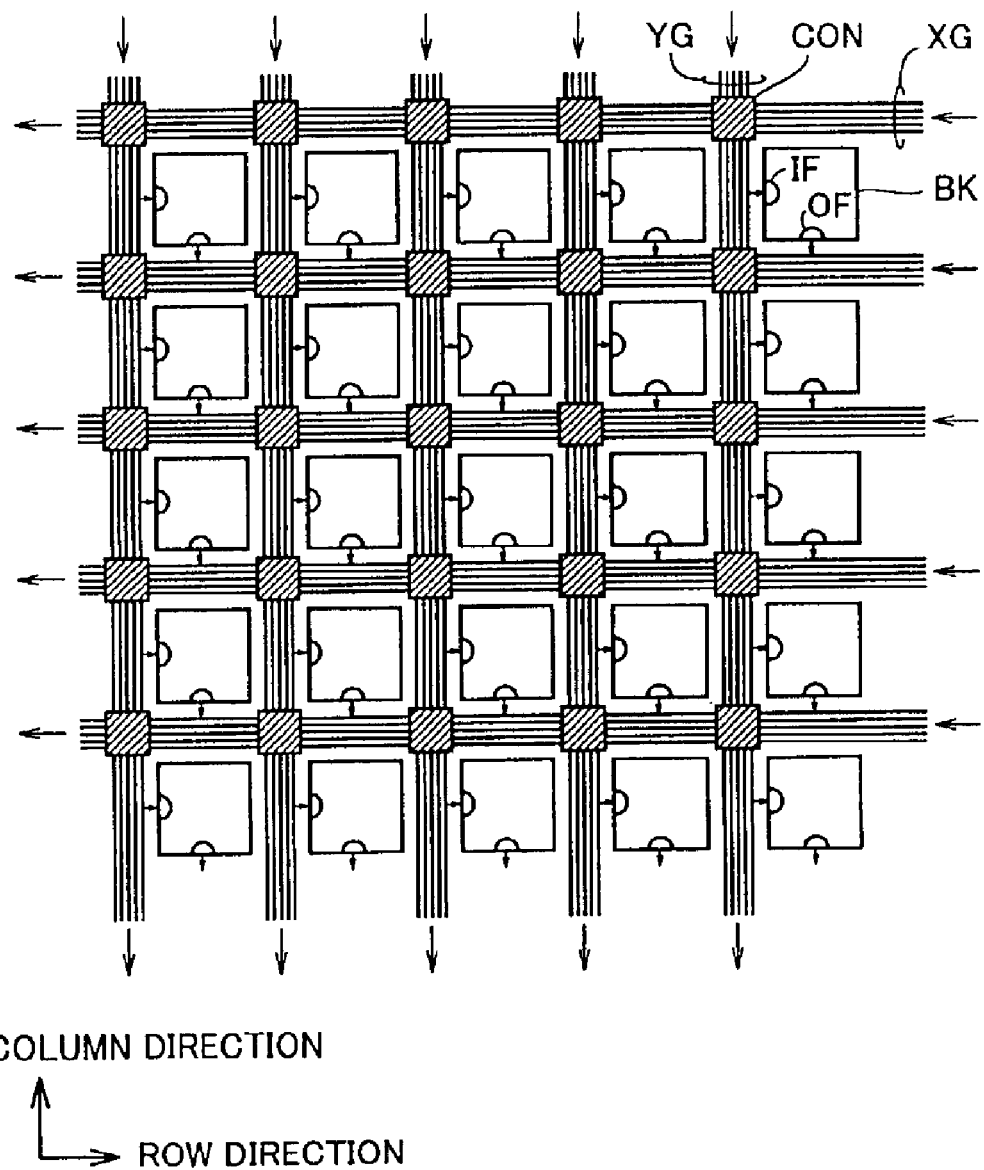
FIG. 27 is a conceptual diagram of an FPGA including a plurality of circuit blocks placed in an array.

Referring to FIG. 27, the FPGA according to the third embodiment includes a plurality of circuit blocks BK arranged in rows and columns, and interconnection regions are provided between these blocks. In the interconnection regions, a plurality of horizontal interconnection groups XG and a plurality of vertical interconnection groups YG are provided in a row direction and in a column direction, respectively.

Each of circuit blocks BK includes an input interface portion IF which receives data signals from neighboring vertical interconnection group YG, and an output interface portion OF which outputs operation results of the circuit block to neighboring horizontal interconnection group XG. Switch portions CON are further provided to electrically connect circuit blocks BK and the interconnection regions. Connection by switch portions CON determines the connect relations between circuit blocks BK.

Figure 28:
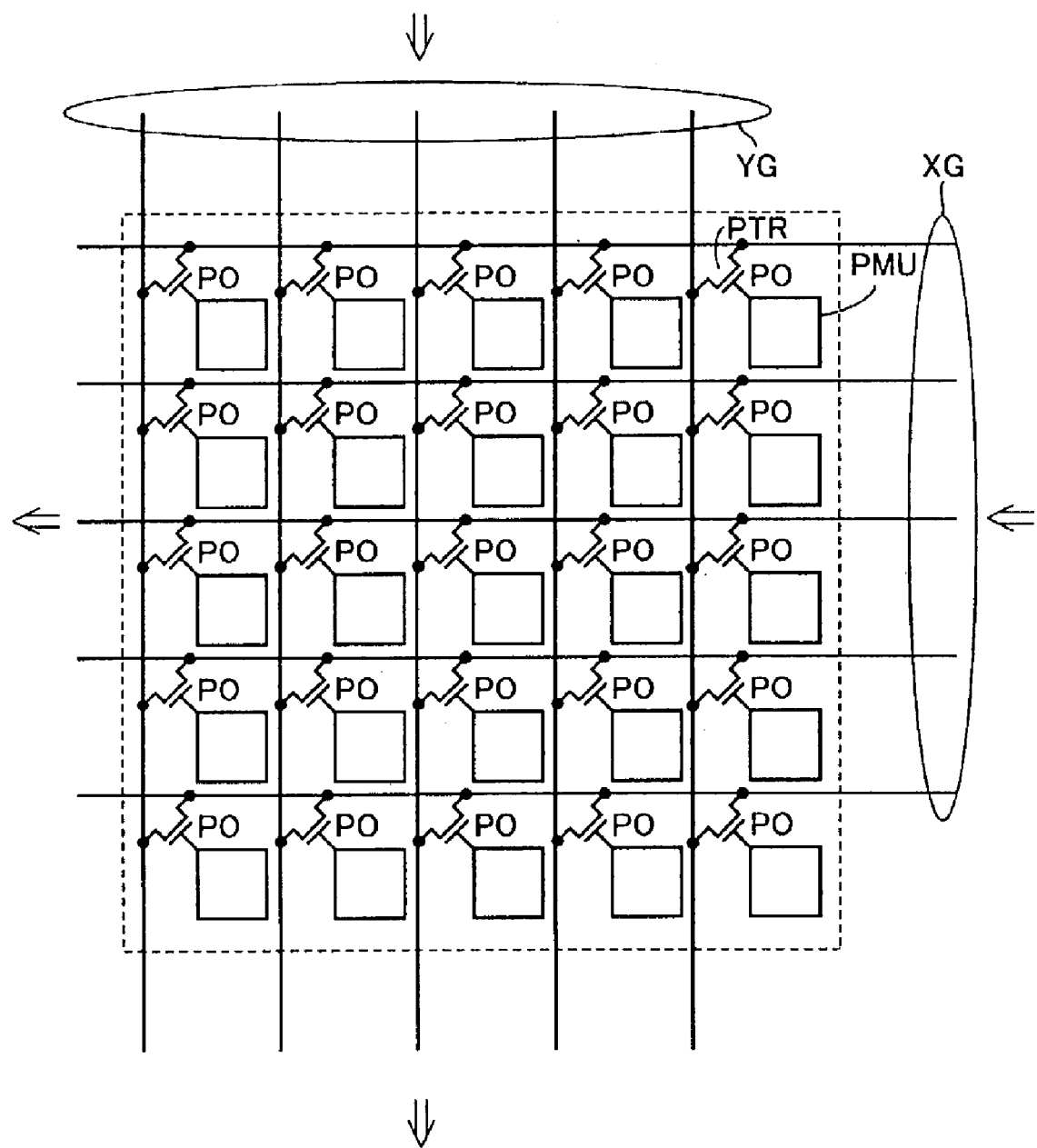
FIG. 28 is a conceptual diagram illustrating a switch portion.

Referring to FIG. 28, each switch portion CON includes a plurality of transistors PTR arranged in rows and columns, and a plurality of program units PMU provided corresponding to the plurality of transistors PTR. Vertical interconnections and horizontal interconnections are provided in the interconnection regions between the blocks, and signals from the horizontal interconnections are selectively transmitted to the vertical interconnections in response to turn-on of the transistors. The program units as described in the second embodiment control the connections of transistors PTR for switching signal paths from the horizontal interconnections to the vertical interconnections.

Thus, as explained in the second embodiment, it is possible to automatically set the system to a connect setting of the initial state upon power-up, in response to control signal POR, based on prestored program data. That is, in the case of hang-up of the program in the middle of the process, for example, control signal POR for resetting the system can be used to decode program data for the basic operations. Accordingly, it is possible to reset the system to the initial state, and thus, to improve fail-safe and stability of the system.

Further, application of the tunneling magneto-resistance elements of program units PMU as the program elements for changing the system of the FPGA allows for an infinite number of times of switching of connections in the system.

In the present example, a plurality of program cell units of more than one bit each are arranged in each program unit PMU as described above in the second embodiment. Thus, each program cell unit can store data independently from each other. The program data thus stored can be read out independently by selectively applying control signals (DA, /DA, REW) to the respective program cell units. As such, the program data can be used efficiently, or, the system design can be changed freely based on the program data read out. For reading of the program data, the various kinds of data read explained in the second embodiment can be carried out, by applying the control signals to the program cell units after short-circuit of nodes N0 and N1 in the latch circuit. Accordingly, rapid reading of data, and hence, rapid changing of system design become possible.

In the third embodiment, the program units perform the various kinds of data write in the same manner as described in the second embodiment, with each program unit being provided with program data PDIN and the control signals as in the second embodiment from a control circuit (not shown) managing and controlling the entire system.

Further, another set of program data may be stored by performing the MTJ write mode and others as explained in the second embodiment, and the connections can then be switched according to the new setting. This allows for free system designing.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film magnetic memory device, comprising:
   a plurality of memory cells each storing data magnetically; and
   a program cell storing program information used for said plurality of memory cells;
   each of said memory cells and said program cell including a magnetic storage portion having an electric resistance value that changes according to a magnetization direction in accordance with a data write current, and
   said program cell further including a state change portion having an electric resistance value that fixedly changes from a first state to a second state in response to an access designation externally supplied.

2. The thin film magnetic memory device according to claim 1, wherein
   said program cell includes
   a first access element controlling electrical connection between said magnetic storage portion and a fixed voltage,
   a second access element controlling electrical connection between said state change portion and a prescribed voltage, and
   a conductor interconnection electrically coupling said first and second access elements to said magnetic storage portion, wherein
   a first region of said conductor interconnection electrically couples said first access element to said magnetic storage portion,
   a second region of said conductor interconnection electrically couples said first access element to said second access element, and
   said second region of said conductor interconnection constitutes said state change portion.

3. The thin film magnetic memory device according to claim 2, wherein said second access element controls the electrical connection of said state change portion with said prescribed voltage and said fixed voltage in response to said access designation externally supplied.

4. The thin film magnetic memory device according to claim 1, wherein said program cell further includes an access element provided between a fixed voltage and a connect node connecting said magnetic storage portion and said state change portion.

5. The thin film magnetic memory device according to claim 1, further comprising:
   a plurality of said program cells arranged in rows and columns;

a plurality of bit lines provided corresponding to the columns respectively;

a plurality of write drivers provided corresponding to said plurality of bit lines, respectively, and each supplying a data write current to corresponding one of said plurality of bit lines in accordance with write data; and a control circuit outputting said write data to at least two of said plurality of write drivers in parallel at the time of data write.

6. A thin film magnetic memory device, comprising:

a plurality of memory cells each storing data magnetically; and a program cell storing program information used for said plurality of memory cells, said program cell including a plurality of state change portions each having an electric resistance changed in accordance with one of an externally supplied access designation and an applied magnetic field, and at least one access element each connecting corresponding two of said state change portions in series with each other to a node to which a data read current is supplied at the time of data read.

7. The thin film magnetic memory device according to claim 6, wherein each said memory cell includes a magnetic storage portion having an electric resistance changed according to a magnetization direction, and at least one of said plurality of state change portions is formed with said magnetic storage portion.

8. A thin film magnetic memory device, comprising:

a plurality of memory cells each storing data magnetically; and a program cell storing program information used for said plurality of memory cells, said program cell including a plurality of state change portions each having an electric resistance changed in accordance with one of an externally supplied access designation and an applied magnetic field, and a plurality of access elements provided corresponding to said plurality of state change portions, respectively, and each controlling electrical connection of the corresponding state change portion with one of a fixed voltage and a prescribed voltage, said plurality of state change portions being provided corresponding to respective pieces of program data constituting said program information, and said plurality of state change portions being set to electric resistance values independently from each other.

9. The thin film magnetic memory device according to claim 8, wherein said plurality of state change portions store said program information of a plurality of bits.

10. The thin film magnetic memory device according to claim 8, wherein one of said plurality of state change portions has a characteristic that its state changes reversibly in accordance with said applied magnetic field.

* * * * *